(12) United States Patent
Kobayashi et al.

(10) Patent No.: US 6,703,877 B2
(45) Date of Patent: Mar. 9, 2004

(54) CLOCK SHAPING CIRCUIT AND ELECTRONIC EQUIPMENT

(75) Inventors: Yoshihiro Kobayashi, Komagame (JP); Nobuyuki Imai, Suwa (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 10/286,418

(22) Filed: Nov. 1, 2002

(65) Prior Publication Data

US 2003/0090305 A1 May 15, 2003

(30) Foreign Application Priority Data

Nov. 2, 2001 (JP) ........................ 2001-338046
Mar. 20, 2002 (JP) ........................ 2002-079761
Sep. 25, 2002 (JP) ........................ 2002-279287

(51) Int. Cl.$^7$ .................................. H03L 7/06
(52) U.S. Cl. ....................... 327/156; 331/DIG. 2; 375/376
(58) Field of Search ................. 327/100, 141, 327/147, 148, 150, 155–159, 291, 295; 331/DIG. 2; 375/373–376

(56) References Cited

U.S. PATENT DOCUMENTS

| 5,123,030 A | * | 6/1992 | Kazawa et al. ............. 375/294 |
| 6,078,224 A | * | 6/2000 | Ujiie .......................... 331/10 |
| 6,081,163 A | * | 6/2000 | Ujiie et al. .................... 331/2 |
| 6,150,858 A | * | 11/2000 | Sung .......................... 327/156 |
| 6,313,708 B1 | * | 11/2001 | Beaulieu ...................... 331/17 |

OTHER PUBLICATIONS

Vectron International Product Data Sheet, FX–104 Frequency Translator, pp. 1–7.

* cited by examiner

Primary Examiner—My-Trang Nu Ton
(74) Attorney, Agent, or Firm—Harness, Dickey & Pierce, P.L.C.

(57) ABSTRACT

In a clock shaping circuit, a phase comparator 31, a selector 76, a loop filter 2, and a VCSO/VCXO 4 form a PLL circuit's main feedback loop during normal operation. When the main feedback loop of the PLL circuit malfunctions due to unlocking, a quartz crystal oscillator circuit is used, and a PLL circuit's backup feedback loop is established, which includes a backup phase comparator 74, the selector 76, the loop filter 2, and the VCSO/VCXO 4.

22 Claims, 16 Drawing Sheets

[FIG. 1]
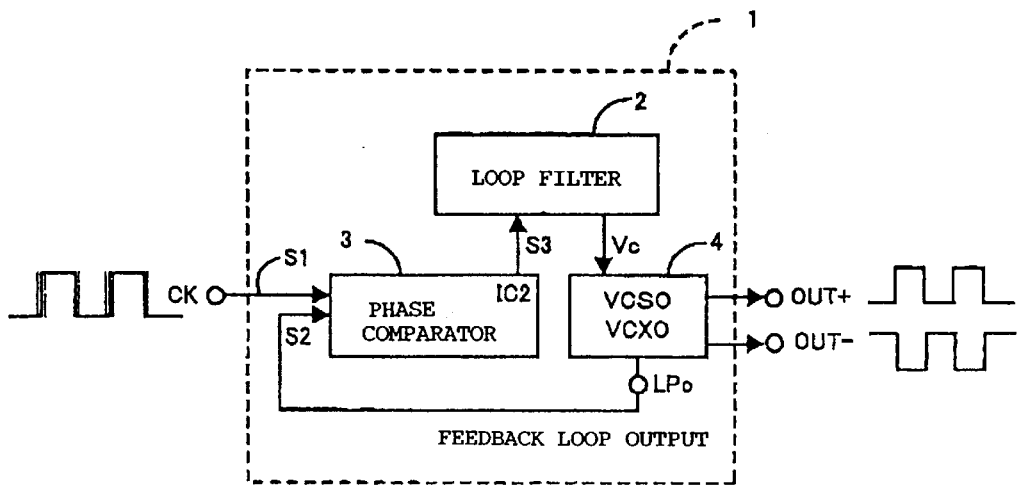
[FIG. 2]
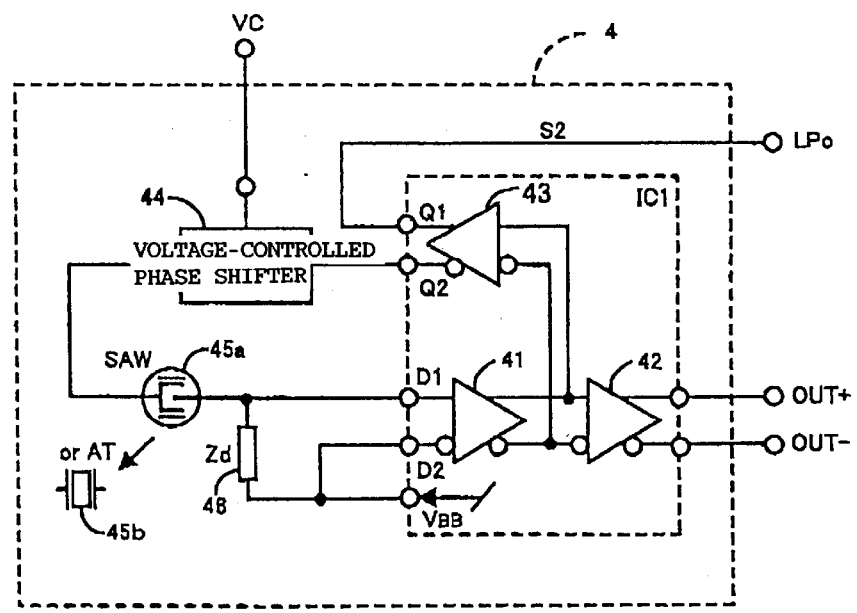

[FIG. 3]
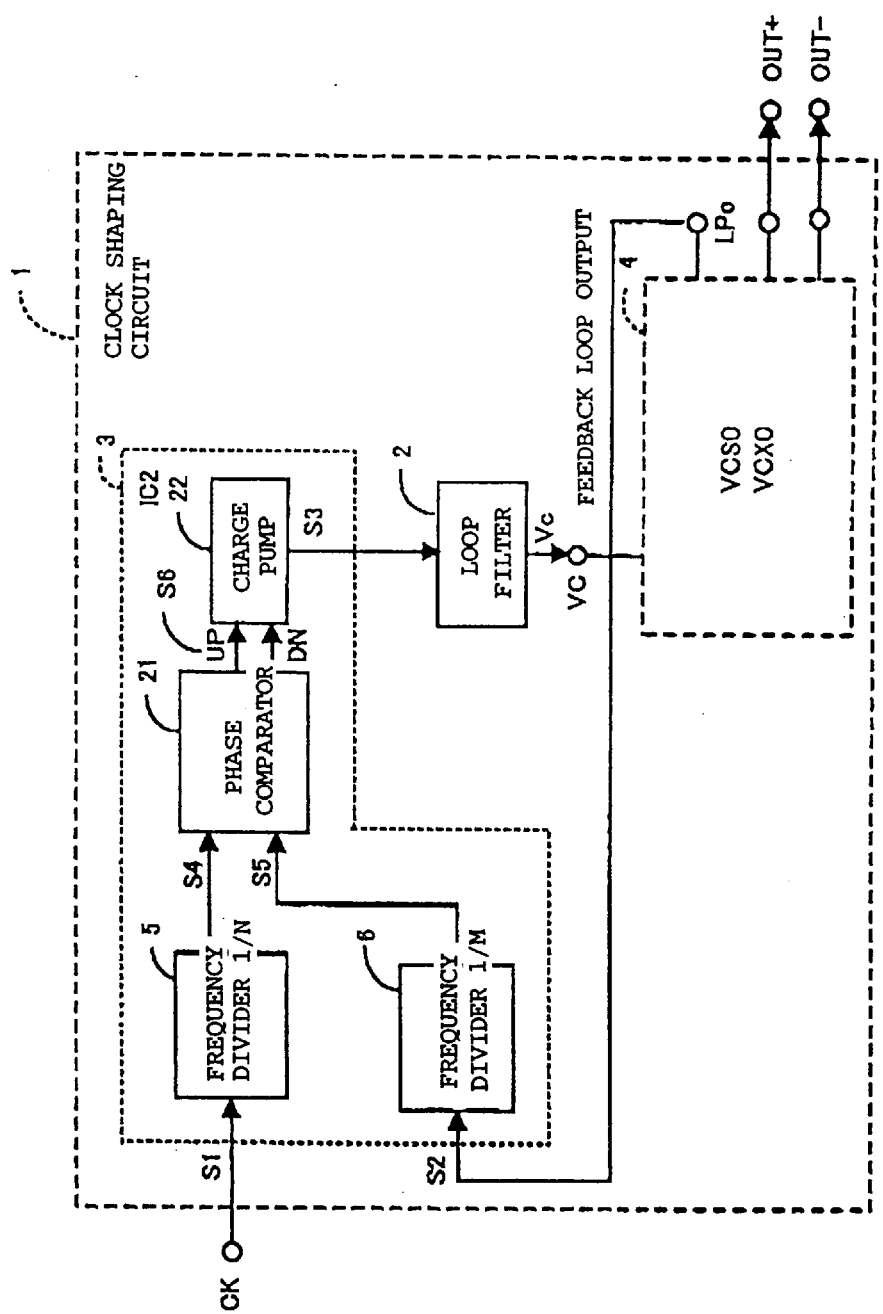

[FIG. 4]
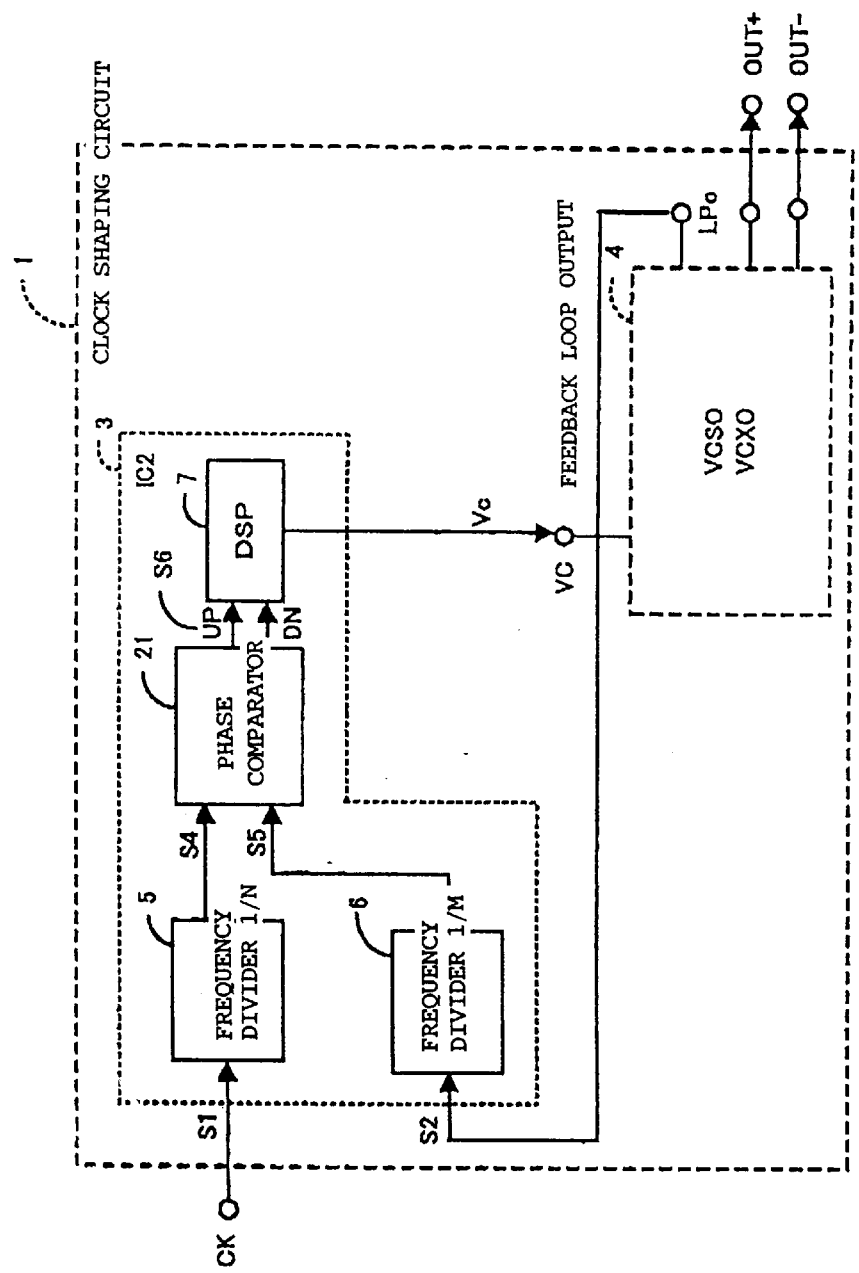

[FIG. 5]
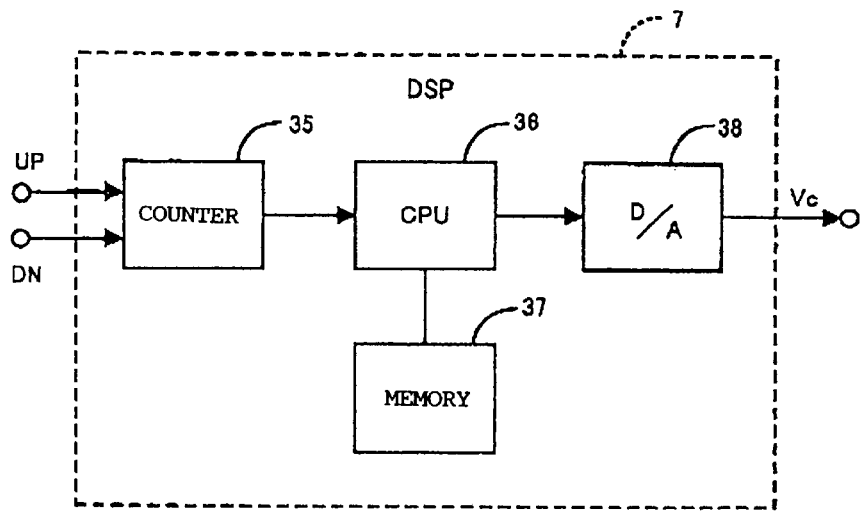

[FIG. 6]
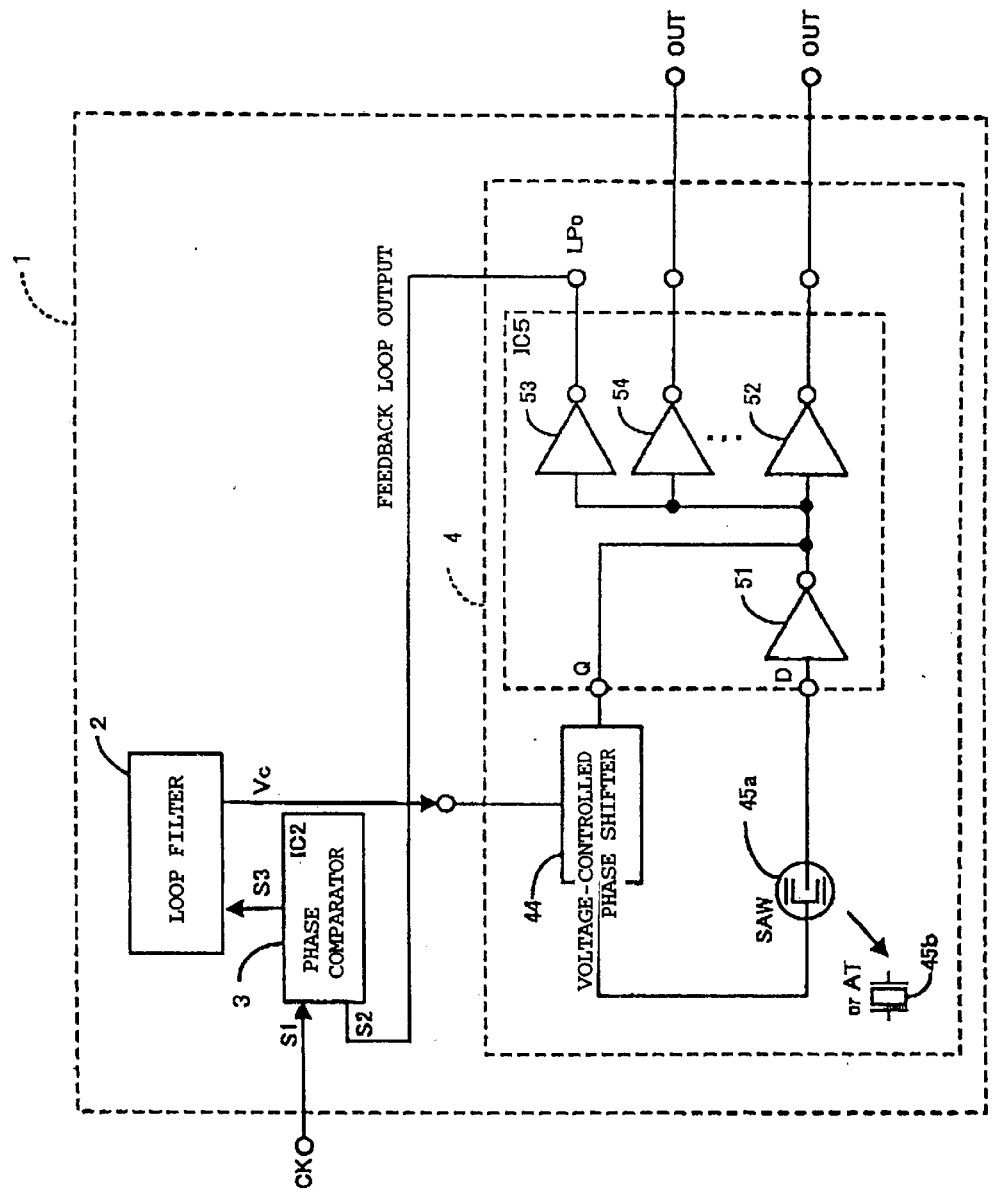

[FIG. 7]
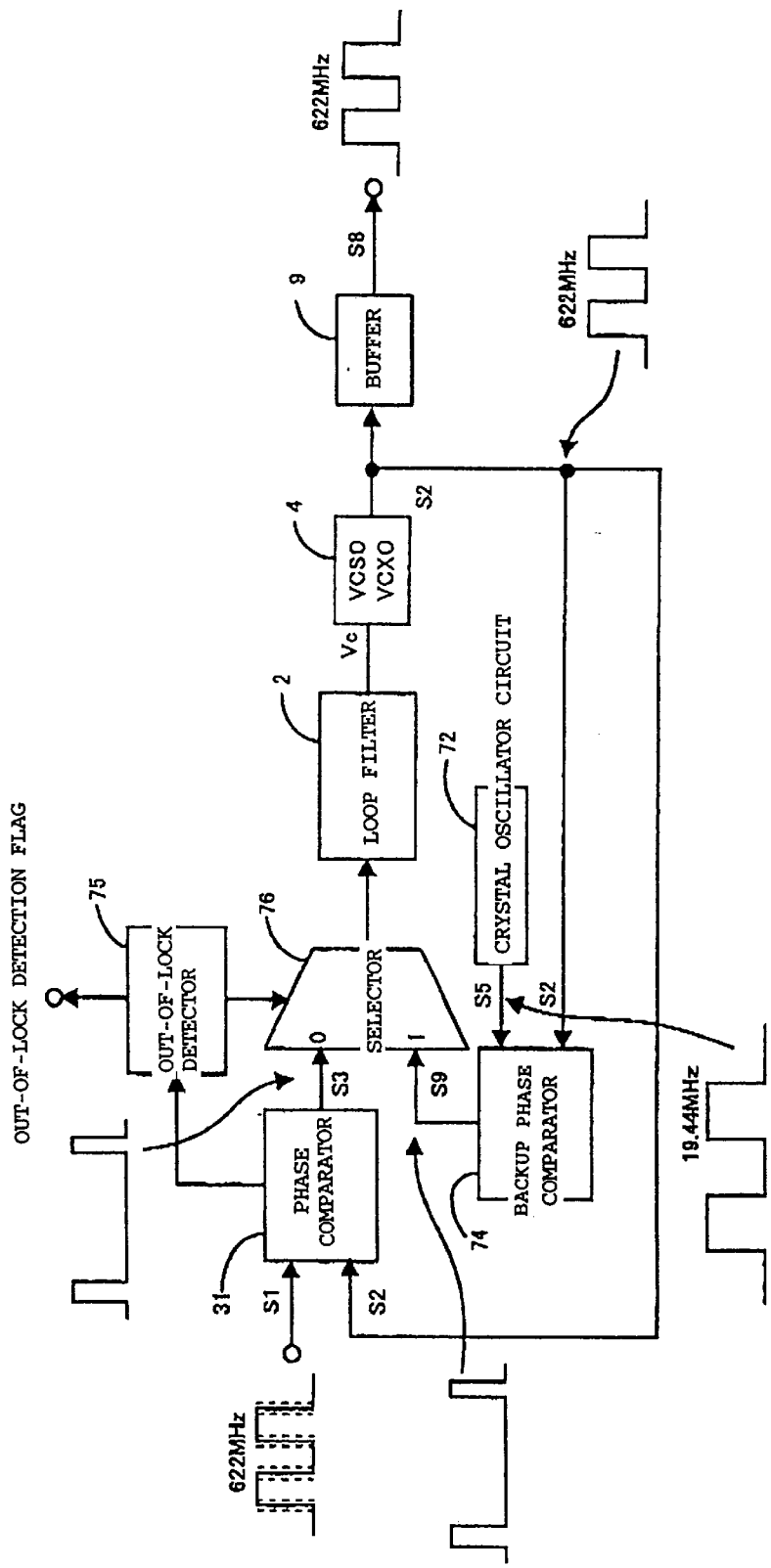

[FIG. 8]
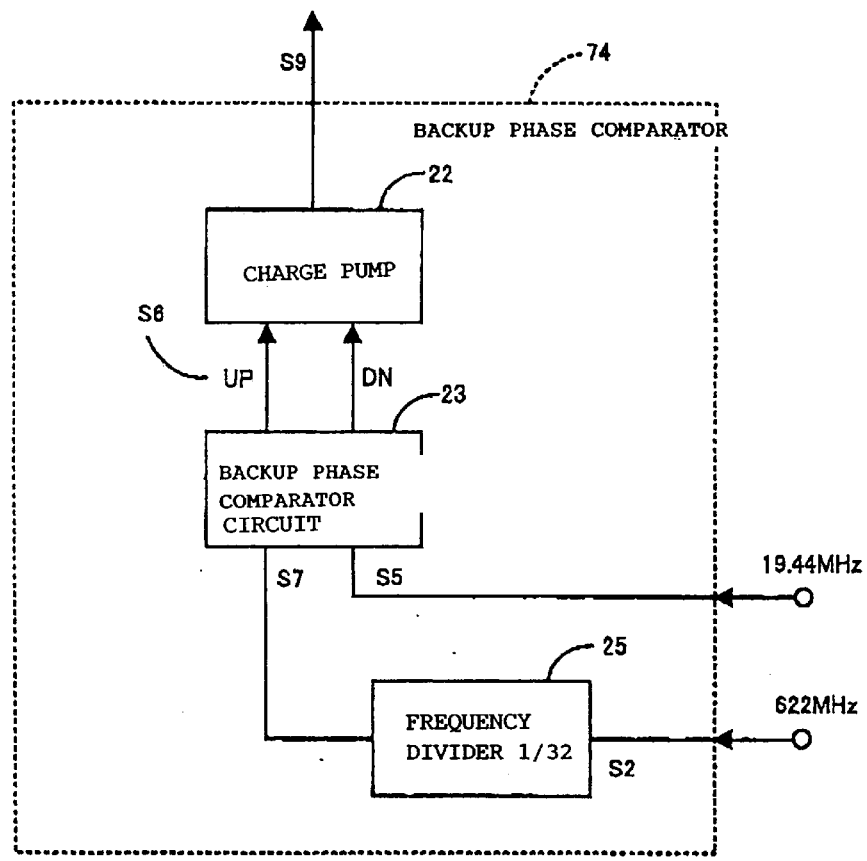

[FIG. 9]
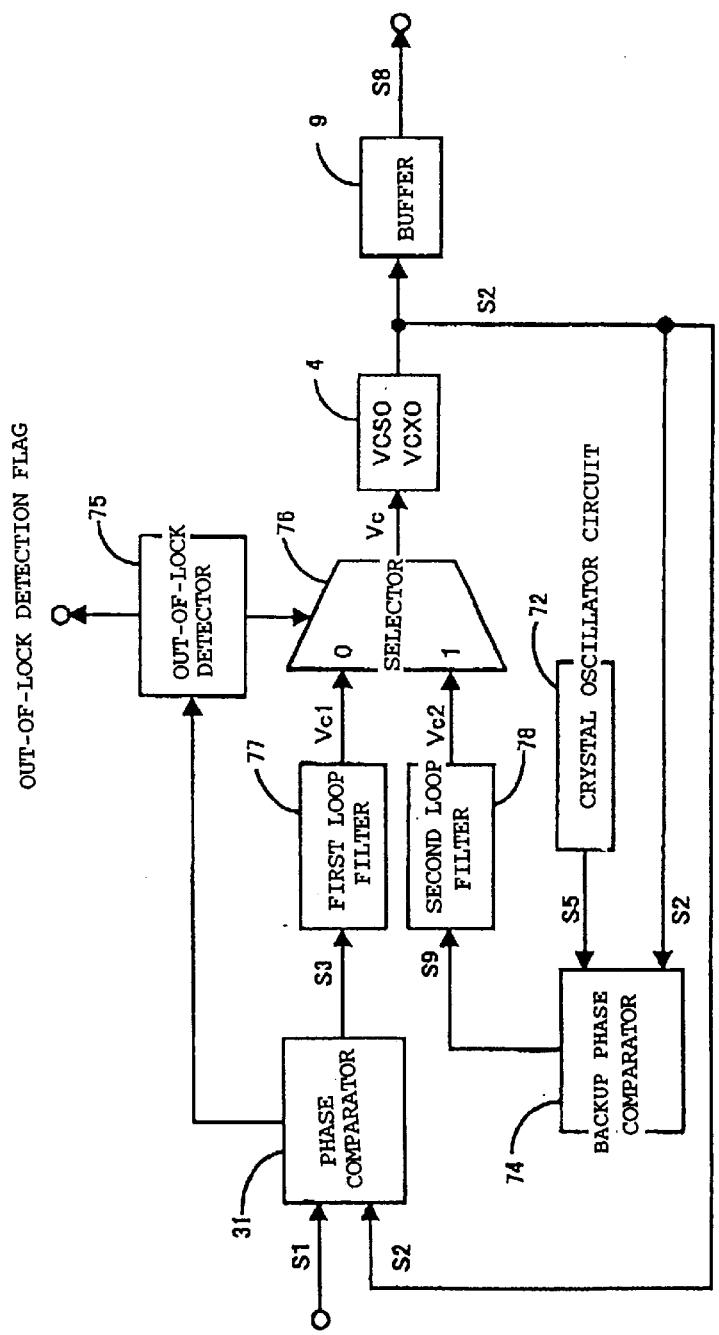

[FIG. 10]
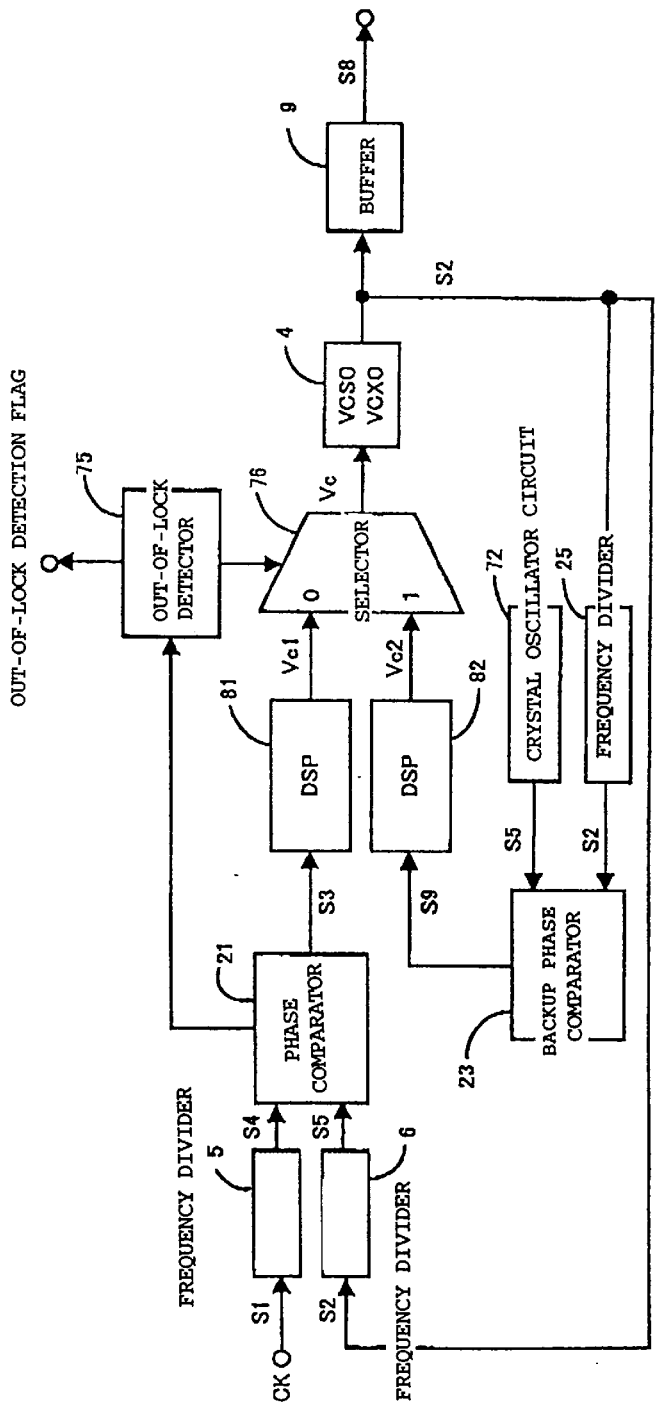

[FIG. 11]
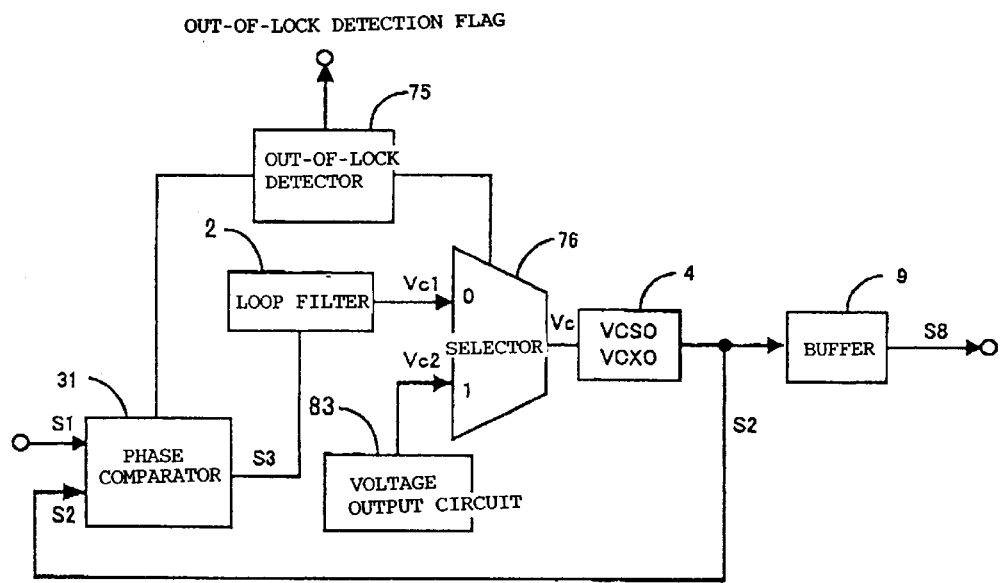

[FIG. 12]
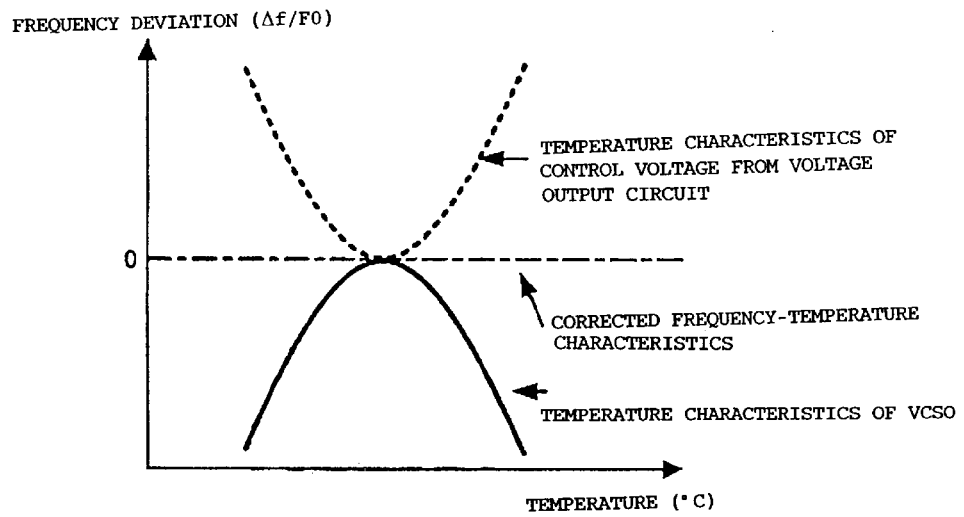

[FIG. 13]
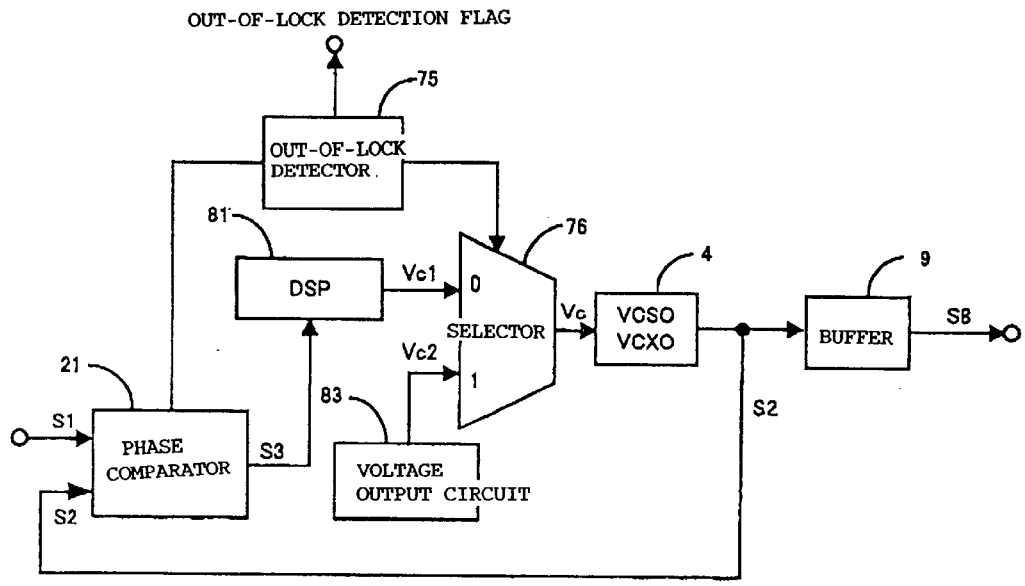
[FIG. 14]
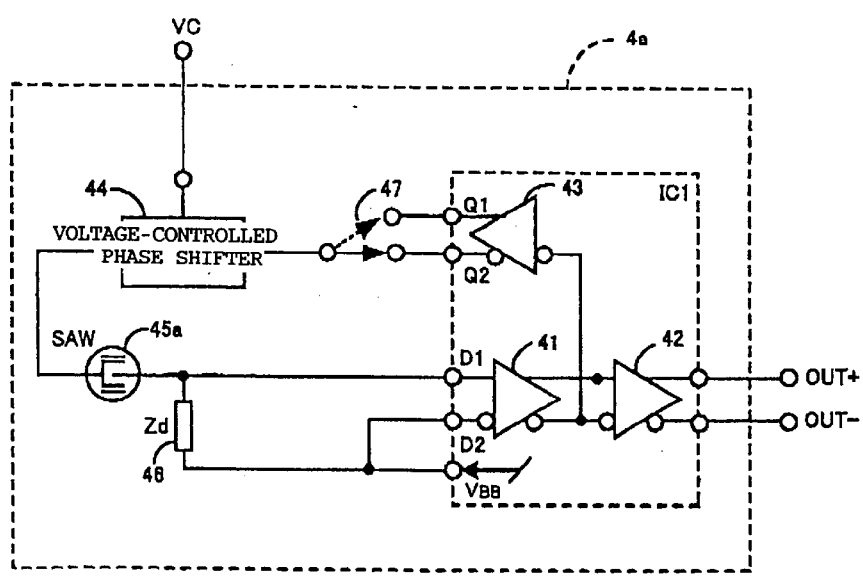

[FIG. 15]
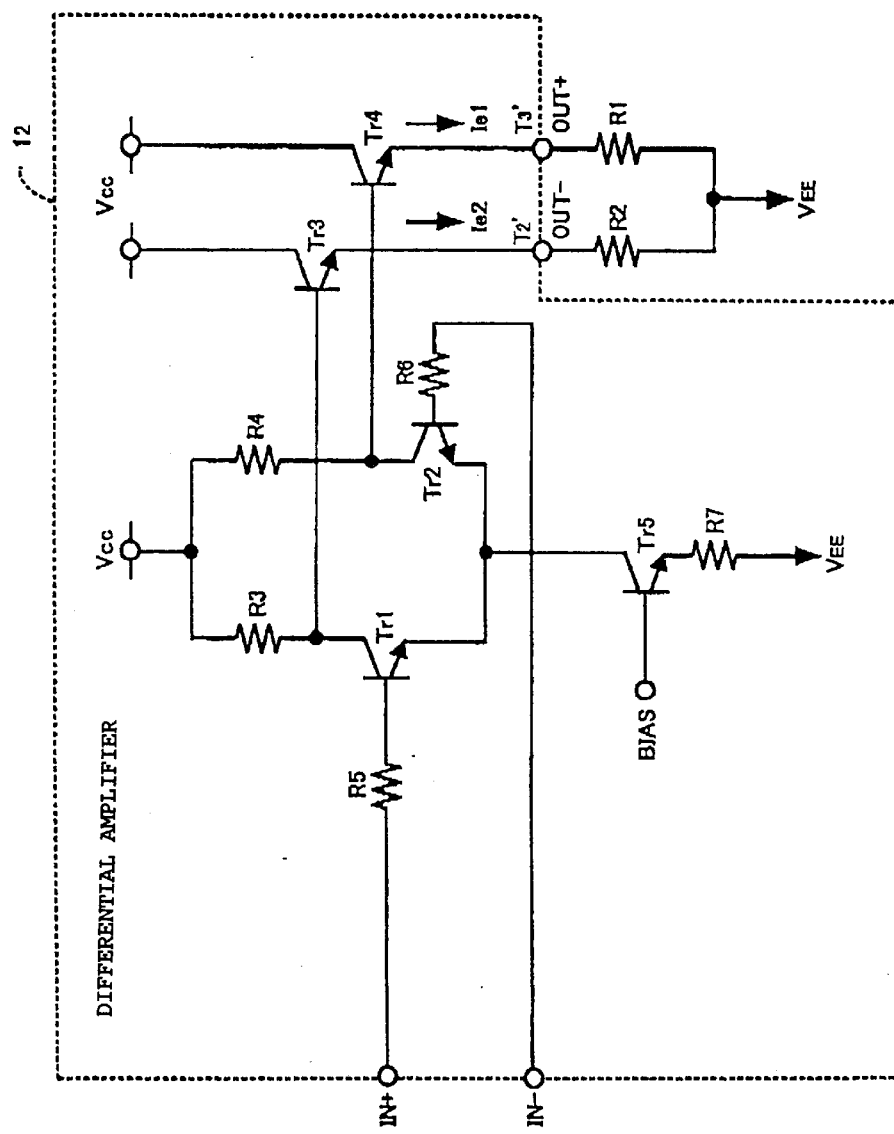

[FIG. 16]
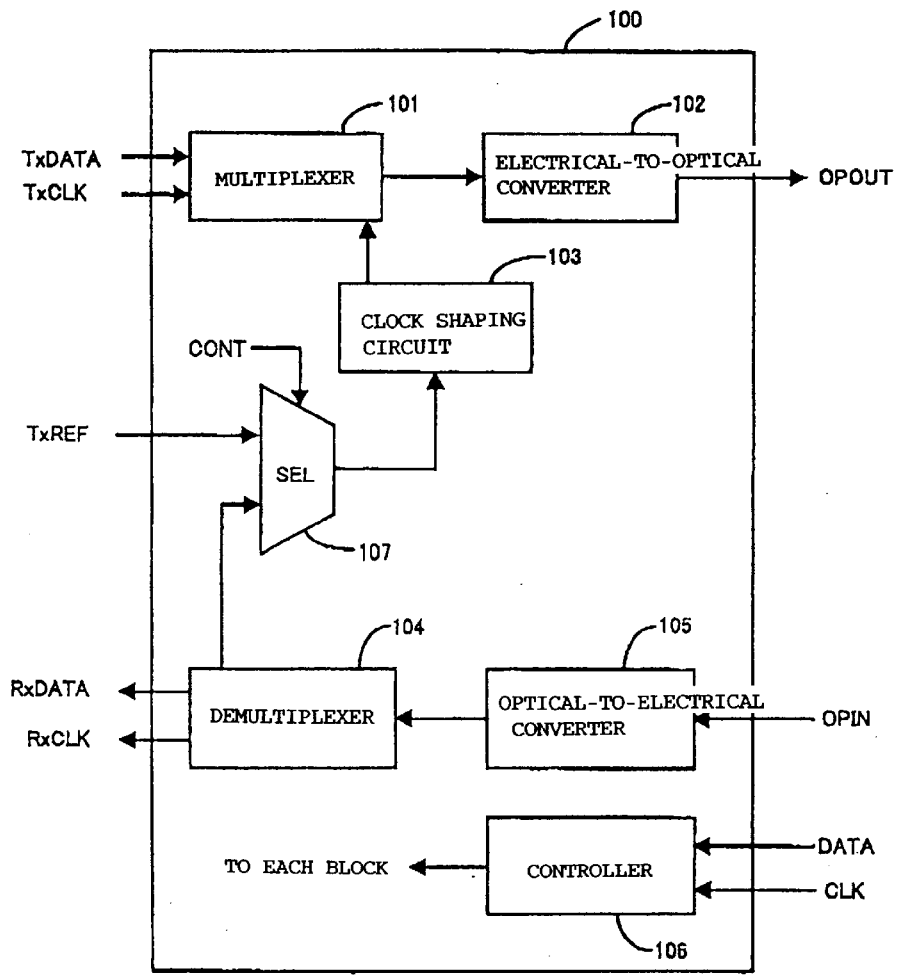
[FIG. 17]
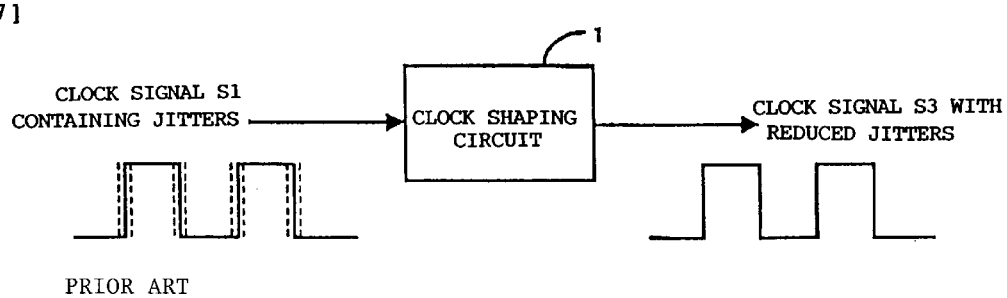
PRIOR ART

[FIG. 18]
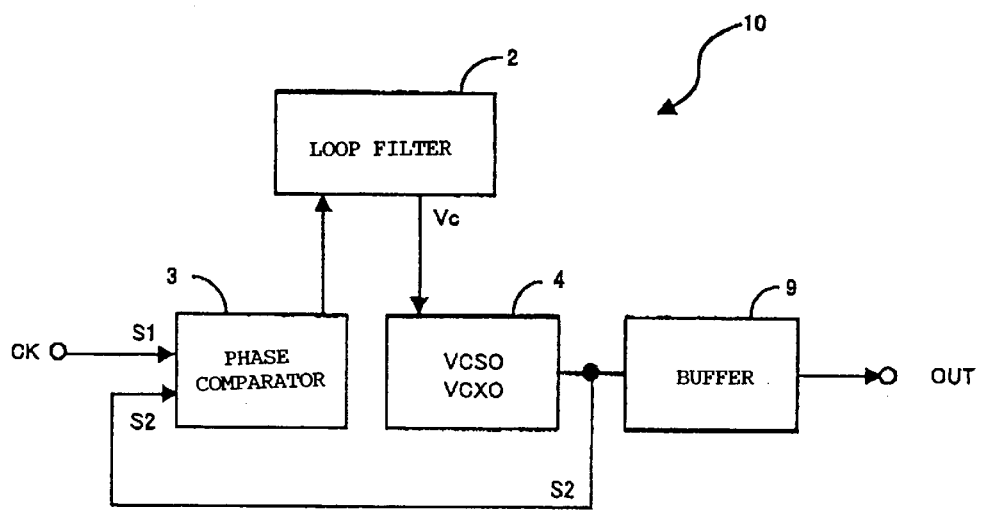
PRIOR ART
[FIG. 19]
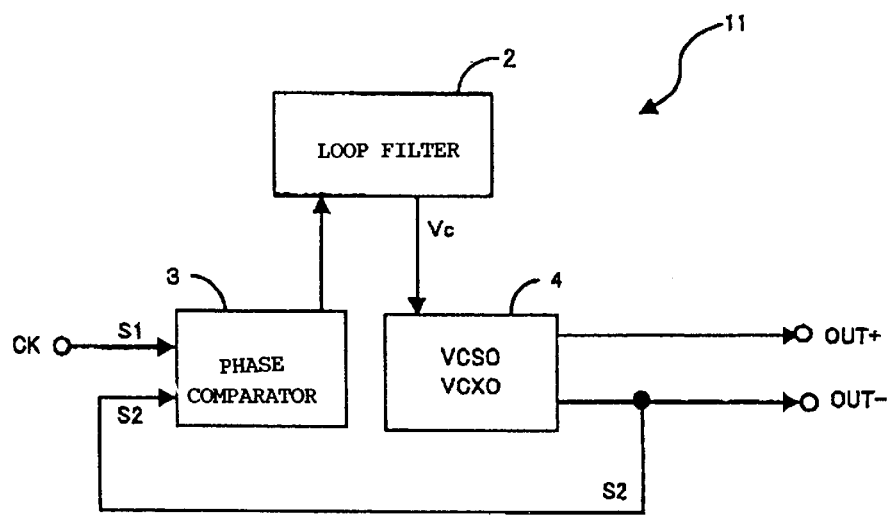
PRIOR ART

[FIG. 20]
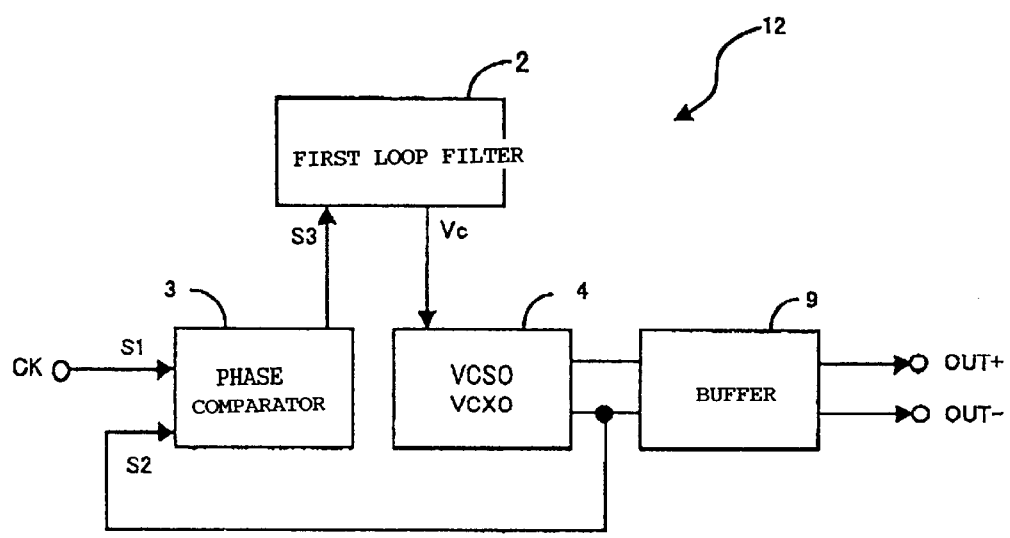
PRIOR ART

CLOCK SHAPING CIRCUIT AND ELECTRONIC EQUIPMENT

BACKGROUND OF THE INVENTION

1. Technical Field of the Invention

The present invention relates to a clock shaping circuit, which receives a clock signal containing jitters and outputs a clock signal with reduced jittering and, in particular, to a clock shaping circuit having a PLL (Phase Locked Loop).

2. Description of the Related Art

To meet a high data rate, an oscillator in electronic equipment such as a communication apparatus must stably oscillate at a high frequency region (with a high frequency stability) and within a practical temperature range (with a temperature compensation).

Communication apparatuses use a clock signal when transmitting or receiving data. In this case, the clock signal must be free from jitters. To obtain a stable and jitter-free clock signal, a clock shaping circuit 10 incorporating a PLL circuit is used as shown in FIGS. 17 and 18.

FIG. 17 is a block diagram generally illustrating a conventional clock shaping circuit.

This clock shaping circuit is widely referred to as a jitter-reducing circuit. The clock shaping circuit is also referred to as a dejittering circuit, a jitter clean-up circuit, or a clock smoothing circuit. A PLL circuit having a voltage-controlled oscillator (a clock generator) is used. In response to a clock signal S1 input thereto containing jittering, a clock shaping circuit 1 outputs a clock signal S3 with the jittering thereof reduced.

In the clock shaping circuit, the voltage-controlled oscillator may employ a voltage-controlled SAW (Surface Acoustic Wave) oscillator VCSO using a SAW resonator, or a voltage-controlled liquid-crystal oscillator (VCXO) to improve phase noise and jitter characteristics.

The clock shaping circuit 10 shown in FIG. 18 includes a phase comparator 3, a loop filter 2, a voltage-controlled oscillator VCSO/VCXO 4, a buffer 9, and a feedback loop (hereinafter simply referred to as a closed loop) of a PLL circuit.

The phase comparator 3 in the clock shaping circuit 10 thus constructed compares the phase of the clock signal S1 containing jitters with the phase of the feedback clock signal (hereinafter referred to as a comparison clock signal) S2 fed back from the VCSO/VCXO 4, and outputs a control signal responsive to the results of the comparison. The output is then subjected a smoothing process through the loop filter 2, and is then applied to a voltage control terminal of the VCSO/VCSO 4, thereby controlling the oscillation of the VCSO/VCSO 4.

Although the clock signal S1 contains a jittering component, the buffer 9 outputs a clock signal with the level of jittering thereof lowered because the loop bandwidth of the PLL circuit limits the frequency component of the jitter.

Conventional clock shaping circuits typically employ an LC-VCO, composed of an inductance and a capacitor, used as the VCO 4, or a ring oscillator. For this reason, the conventional clock shaping circuits suffer from poor phase noise characteristics and poor jitter characteristics, and is unable to reduce jitters.

To improve phase noise and jitter characteristics, one clock shaping circuit employs a voltage-controlled crystal oscillator VCXO or a voltage-controlled SAW oscillator VCSO with a SAW resonator, as a voltage-controlled oscillator VCO shown in FIG. 19.

The SAW resonator is one which makes use of the property of an elastic body that concentrates and propagates energy near the surface of the body. Interdigital transducers are disposed on a piezoelectric substrate. A surface acoustic wave excited by the transducers are reflected, generating a standing wave. The assembly thus functions as a resonator. The SAW resonator oscillates within a frequency range from several tens of MHz to several hundreds of MHz. In terms of frequency-temperature characteristics and costs, this resonator is less preferable than an AT cut quartz crystal resonator.

Interfacing such as impedance matching in an input/output interface and a transmission line (a wiring line for interconnection in this case) is somewhat difficult in terms of the transfer of a clock signal in the above construction in a high frequency region of several hundreds of MHz. The input and output sides adversely affect each other, thereby lowering an output amplitude level of a signal. In case of a differential output, the amplitudes of output signals between a positive output terminal and a negative output terminal are unbalanced, and a phase difference occurs between the two terminals.

To avoid the problem, a known clock shaping circuit shown in FIG. 20 includes, as a separate integrated circuit (hereinafter referred to as an IC), an output buffering driver IC (a buffer 9) attached to the output of a voltage-controlled crystal oscillator VCXO or a voltage-controlled SAW oscillator VCSO. The addition of the output buffering driver IC increases a component count, and a compact design is difficult to implement in the clock shaping circuit.

There are times when, for some reason, the conventional clock shaping circuit suffers from an interruption of the supply of the clock signal S1 from the outside, a substantial change in the frequency thereof, and an out-of-lock state in the phase and frequency. In such a case, a closed loop enters a free run condition. The clock shaping circuit fails to output a stable clock signal having excellent phase noise and jitter characteristics. If data is transferred based on that clock signal, data transfer malfunctions.

The reasons why the output clock signal loses its stability in the free-run state are that a control signal applied to the VCO 4 is not appropriate, and that the frequency varies due to the temperature characteristics of the VCO 4. If the VCO 4 is formed of a voltage-controlled oscillator LC-VCO composed of a capacitor and inductance, a ring oscillator, or a voltage-controlled SAW oscillator having a SAW resonator, an inconvenience of frequency variation due to a change in temperature becomes large.

The present invention has been developed to resolve the above problem, and it is an object of the present invention to provide a clock shaping circuit, which does not directly affect a clock signal when the output of the voltage-controlled quartz crystal oscillator VCXO, or the voltage-controlled SAW oscillator VCSO, is used as a feedback loop output., and which is free from an unbalance of an output amplitude and a phase difference in differential outputs between positive and negative output terminals.

It is another object of the present invention to provide a clock shaping circuit, which has a smaller component count with no output buffering driver IC required, and is easy to miniaturize.

It is yet another object of the present invention to provide a clock shaping circuit, which outputs a clock signal with less jitters even when an out-of-lock state occurs for some reason.

It is a further object of the present invention to provide a clock shaping circuit, which includes a voltage-controlled SAW oscillator exhibiting improved frequency-temperature characteristics regardless of a change in temperature.

It is still a further object of the present invention to provide electronic equipment, which continuously operates without interruption with a clock shaping circuit thereof assuring a clock signal containing less jittering even when the clock shaping circuit is unlocked for some reason.

SUMMARY OF THE INVENTION

A clock shaping circuit of a first aspect includes a clock generator, which changes a frequency of an output comparison clock signal in response to a supplied control voltage, a phase comparator, which generates a phase difference signal based on the results of comparison of the comparison clock signal from the clock generator with an input signal from the outside, and a loop filter for smoothing the phase difference signal, wherein the clock generator includes a positive feedback oscillation loop including, at least, a piezoelectric resonator, an oscillation differential amplifier, a feedback buffering differential amplifier, and a voltage-controlled phase shifter for shifting a phase by a predetermined amount in response to the control voltage, and wherein the output signal from the feedback buffering differential amplifier is the comparison clock signal.

In accordance with the first invention, the output signal from either a non-inverting output terminal and or an inverting output terminal of the feedback buffering differential amplifier in the clock generator is used as a feedback loop output, which means the comparison clock signal. Because this structure is adopted, there is no unbalance of the output amplitudes and the phase difference of the outputs of the non-inverting and the inverting terminals for the differential amplifier.

A clock shaping circuit of a second invention includes a clock generator, which changes a frequency of an output comparison clock signal in response to a supplied control voltage, a phase comparator, which generates a phase difference signal based on the results of the comparison of the comparison clock signal from the clock generator with an input signal from the outside, and a loop filter for smoothing the phase difference signal, wherein the clock generator includes a positive feedback oscillation loop including, at least, a piezoelectric resonator, a voltage-controlled phase shifter, and an oscillation amplifier, and further a plurality of output amplifiers, and wherein the comparison clock signal is the output signal from one of the plurality of output amplifiers, which branch the output signal of the oscillation amplifier.

In accordance with the second aspect, one of the output signals from one of the plurality of output amplifiers, which branch the output signal of the oscillation amplifier, is used as the comparison clock signal. This arrangement prevents the output amplitude from dropping in level, thereby eliminating the need for connecting an output buffering driver IC to the output of the clock generator. The clock shaping circuit becomes compact in design with the component count thereof reduced.

In a clock shaping circuit of a third aspect, the feedback buffering differential amplifier has a non-inverting output terminal and an inverting output terminal, one of the output terminals has the function of outputting the comparison clock signal and the other of the output terminals has the function of outputting a positive feedback oscillation loop output.

In accordance with the third aspect, one of the two output terminals of the feedback buffering differential amplifier serves as the comparison clock signal output terminal and the other of the two output terminals serves as the positive feedback oscillation loop output terminal. In this arrangement, one single feedback buffering differential amplifier is used as a feedback loop and a positive feedback loop.

In a clock shaping circuit of a fourth aspect, each of the oscillation differential amplifier and the feedback buffering differential amplifier is a differential amplifier employing an ECL line receiver.

Since the ECL line receiver is a differential amplifier circuit having non-inverting and inverting differential outputs in accordance with the fourth aspect, a clock shaping circuit operates at a low power consumption and at a high speed.

In a clock shaping circuit of a fifth aspect, the phase comparator includes, at least, a first divider means for frequency-dividing the input signal from the outside, and a second divider means for frequency-dividing the comparison clock signal.

In accordance with the fifth aspect, the phase comparator circuit in the phase comparator includes the first divider and the second divider, each having a respective predetermined divide-by ratio, and low frequency outputs provided by the phase comparator circuit are compared. This arrangement permits the use of a low speed IC. A low-cost and highly accurate phase comparator thus results.

In a clock shaping circuit of a sixth aspect, the piezoelectric resonator is a SAW resonator.

In accordance with the sixth aspect, the SAW resonator is used as the piezoelectric resonator. A high-frequency output is thus easy to obtain.

In a clock shaping circuit of a seventh aspect, the piezoelectric resonator is a quartz crystal resonator.

Since an oscillation source of the clock shaping circuit is a AT cut quartz crystal oscillator in accordance with the seventh aspect, a highly stable output is obtained.

A clock shaping circuit of an eighth aspect includes a phase comparator, which compares an input clock signal with a comparison clock signal in phase, and outputs a signal responsive to the results of the comparison, a quartz crystal oscillator circuit, which generates a backup clock signal having a predetermined frequency corresponding to the input clock signal, a backup phase comparator, which compares, in phase, the backup clock signal generated by the quartz crystal oscillator circuit with the comparison clock signal and outputs a signal responsive to the results of the comparison, an out-of-lock detector, which detects a phase out-of-lock state based on the input clock signal and the comparison clock signal, a selector, which selects and outputs either the output signal of the phase comparator or the output signal of the backup phase comparator in response to the detection of the out-of-lock detector, a loop filter, which performs a smoothing process on the output signal selected by the selector, and a clock generator, which generates the comparison clock signal while varying the frequency of the comparison clock signal in accordance with the output signal of the loop filter.

In accordance with the eighth aspect, if a main closed loop is unlocked after the input of the clock signal from the outside is interrupted for some reason or after jittering in the clock signal becomes large in level, the main closed loop is changed to a backup closed loop. The comparison clock signal from the VCSO/VCSO and a backup clock signal from the quartz crystal oscillator are used.

Even if the main closed loop enters a free run condition for some reason, a clock signal remains stable and has less jittering.

In a clock shaping circuit of a ninth aspect, the quartz crystal oscillator circuit is a temperature-compensated quartz crystal oscillator circuit.

In accordance with the ninth aspect, the use of the temperature-compensated quartz crystal oscillator circuit provides the clock signal having stable temperature characteristics even under severe temperature conditions.

In a clock shaping circuit of a tenth aspect, the backup phase comparator includes a divider, which frequency-divides the comparison clock signal generated by the clock generator, and the backup phase comparator compares, in phase, the predetermined backup clock signal generated by the quartz crystal oscillator circuit and the output signal of the divider, and outputs a signal responsive to the results of the comparison.

In accordance with the tenth aspect, the divider in the backup phase comparator frequency-divides the comparison clock signal generated by the clock generator down to the range of the predetermined backup clock signal generated by the quartz crystal oscillator circuit. Since the backup phase comparator compares the two frequencies in a low frequency range, a low-speed IC works and is used. A low-cost and high-precision phase comparator is thus manufactured.

In a clock shaping circuit of an eleventh aspect, the clock generator includes a voltage-controlled SAW oscillator circuit.

In accordance with the eleventh aspect, the use of the SAW resonator as a piezoelectric resonator easily results in an output of high frequency.

A clock shaping circuit of a twelfth aspect, the clock generator includes a voltage-controlled quartz crystal oscillator circuit.

In accordance with the twelfth aspect, the use of the quartz crystal resonator as a piezoelectric resonator assures a clock signal having stable temperature characteristics.

A clock shaping circuit of a thirteenth aspect includes a phase comparator, which compares, in phase, an input clock signal with a comparison clock signal, and outputs a signal responsive to the results of the comparison, a quartz crystal oscillator circuit, which generates a backup clock signal having a predetermined frequency corresponding to the input clock signal, a backup phase comparator, which compares, in phase, the backup clock signal generated by the quartz crystal oscillator circuit with the comparison clock signal and outputs a signal responsive to the results of the comparison, a first loop filter, which performs a smoothing process on the output signal of the phase comparator, a second loop filter, which performs a smoothing process on the output signal of the backup phase comparator, an out-of-lock detector, which detects a phase out-of-lock state based on the input clock signal and the comparison clock signal, a selector, which selects and outputs either the output signal of the first loop filter or the output signal of the second loop filter, in response to the detection of the out-of-lock detector, and a clock generator, which generates the comparison clock signal while varying the frequency of the comparison clock signal in accordance with the output signal selected by the selector.

In accordance with the thirteenth aspect, if the closed loop is unlocked, the main closed loop is switched to a closed loop that uses the backup clock signal generated by the quartz crystal oscillator circuit. In this arrangement, the two loop filters including the second loop filter are arranged, and low frequency characteristics appropriate for the closed loops, routed in the phase comparator and the backup phase comparator respectively, are set for the two loop filters. The closed loop becomes thus stable, thereby resulting in a more stable clock signal.

In a clock shaping circuit of a fourteenth aspect, the quartz crystal oscillator circuit is a temperature-compensated quartz crystal oscillator circuit.

In accordance with the fourteenth aspect, the use of the temperature-compensated quartz crystal oscillator circuit provides the clock signal having stable temperature characteristics even under severe temperature conditions.

In a clock shaping circuit of a fifteenth aspect, the backup phase comparator compares, in phase, the output signal, which is obtained by frequency-dividing the comparison clock signal generated by the clock generator by the divider, with the predetermined backup clock signal generated by the quartz crystal oscillator circuit, and outputs a signal responsive to the results of the comparison.

In accordance with the fifteenth aspect, the divider in the backup phase comparator frequency-divides the comparison clock signal generated by the clock generator down to the range of the predetermined backup clock signal generated by the quartz crystal oscillator circuit. Since the backup phase comparator compares the two frequencies in a low frequency range, a low-speed IC is used. A low-cost and high-precision backup phase comparator is thus manufactured.

In a clock shaping circuit of a sixteenth aspect, the clock generator includes a voltage-controlled SAW oscillator circuit.

In accordance with the sixteenth aspect, the use of the SAW resonator as a piezoelectric resonator easily results in an output of high frequency.

In a clock shaping circuit of a seventeenth aspect, the clock generator includes a voltage-controlled quartz crystal oscillator circuit.

In accordance with the seventeenth aspect, the use of the quartz crystal resonator as a piezoelectric resonator assures a clock signal having stable temperature characteristics.

In a clock shaping circuit of an eighteenth aspect, the phase comparator includes a phase comparator circuit and a first charge pump, which converts the output of a phase comparator circuit into a DC voltage corresponding to a phase difference of an input signal to the phase comparator, and the backup phase comparator includes a backup phase comparator circuit and a second charge pump, which converts the output of a phase comparator circuit into a DC voltage corresponding to a phase difference of an input signal to the phase comparator.

In accordance with the eighteenth aspect, the phase comparator includes the phase comparator circuit and the charge pump having a simple structure, and the backup phase comparator includes the backup phase comparator circuit and the charge pump having a simple structure. A low-cost phase comparator and a low-cost backup phase comparator are easily manufactured.

In a clock shaping circuit of a nineteenth aspect, a first digital signal processor (DSP) is substituted for the first charge pump and the first loop filter, and a second digital signal processor (DSP) is substituted for the second charge pump and the second loop filter.

In accordance with the nineteenth aspect, the DSP substituted for the loop filter permits digital processing, and a substantially compact design is implemented. Noise resistance to external noise is thus improved.

A clock shaping circuit of a twentieth aspect includes a phase comparator, which compares, in phase, an input clock signal with a comparison clock signal, and outputs a signal responsive to the results of the comparison, a loop filter, which performs a smoothing process on the output signal of the phase comparator, a voltage output circuit, which outputs a predetermined voltage responsive to the output signal of the loop filter, an out-of-lock detector, which detects a phase out-of-lock state based on the input clock signal and the comparison clock signal, a selector, which selects and outputs either the output signal of the loop filter or the output signal of the voltage output circuit in response to the detection of the out-of-lock detector, and a clock generator, which generates the comparison clock signal while varying the frequency of the comparison clock signal in accordance with the output signal selected by the selector.

In accordance with the twentieth aspect, the main closed loop is disengaged and the VCSO is supplied with the output of the voltage output circuit when the standard closed circuit is unlocked during the operation of the clock shaping circuit. The frequency-temperature characteristics of the VCSO are improved by imparting temperature dependency to the constant voltage of the voltage output circuit to cancel the effect of temperature in the temperature characteristics of the VCSO in a low temperature region and a high temperature region (temperature compensation).

In a clock shaping circuit of a twenty-first aspect, the clock generator includes a voltage-controlled SAW oscillator circuit.

In accordance with the twenty-first aspect, the use of a SAW resonator as a piezoelectric resonator easily results in a high-frequency output.

In a clock shaping circuit of a twenty-second aspect, the clock generator includes a voltage-controlled quartz crystal oscillator circuit.

In accordance with the twenty-second aspect, the use of a quartz crystal resonator as a piezoelectric resonator assures a clock signal having reliable temperature characteristics.

In a clock shaping circuit of a twenty-third aspect, the phase comparator includes a charge pump, which converts the output of a phase comparator circuit into a DC voltage responsive to the phase difference of an input signal to the phase comparator.

In accordance with the twenty-third aspect, a low-cost phase comparator is easily manufactured because the phase comparator is formed of the phase comparator circuit and the charge pump having a simple structure.

In a clock shaping circuit of a twenty-fourth aspect, a digital signal processor (DSP) is substituted for the charge pump and the loop filter.

In accordance with the twenty-fourth aspect, the DSP substituted for the loop filter permits digital processing. Therefor a substantially compact design is possible to implement. Noise resistance to external noise is thus improved.

A clock shaping circuit of a twenty-fifth aspect, the voltage output circuit sets the predetermined voltage to any voltage at a variable level.

In accordance with the twenty-fifth aspect, the voltage output circuit immediately responds to an out-of-lock state by setting the output voltage thereof to be variable when the closed loop is unlocked in response to an excessively enlarged jitter in the clock signal.

In a clock shaping circuit of a twenty-sixth aspect, the output voltage of the voltage output circuit has a temperature-dependent property so that the oscillation output of the clock generator is temperature compensated.

In accordance with the twenty-sixth aspect, the frequency-temperature characteristics of the VCSO are improved by imparting temperature dependency to the constant voltage of the voltage output circuit to cancel the effect of temperature in the temperature characteristics of the VCSO in a low temperature region and a high temperature region (temperature compensation).

The clock shaping circuit thus constructed of the present invention continuously outputs a desired clock signal having reduced jittering even if the supply of the clock signal from the outside is interrupted or even if the closed loop is unlocked as a result of excessive jittering in the clock signal. Specifically, the clock shaping circuit of the present invention uses the quartz crystal oscillator by switching to the backup closed loop when the main closed loop enters a free run condition for some reason. A stable clock signal with reduced phase noise and reduced jittering thus results.

In a clock shaping circuit of a twenty-seventh aspect, the clock generator in the clock shaping circuit includes a piezoelectric resonator, an oscillation differential amplifier, a feedback buffering differential amplifier, and a voltage-controlled phase shifter for shifting a phase by a predetermined amount in response to a control voltage, a positive feedback oscillation loop is formed of, at least, the piezoelectric resonator, the oscillation differential amplifier, the feedback buffering differential amplifier, and the voltage-controlled phase shifter, and the output signal of the feedback buffering differential amplifier is the comparison clock signal.

In accordance with the twenty-seventh aspect, either the outputs from the non-inverting output terminal or the inverting-output terminal of the feedback buffering differential amplifier in the clock generator is used as a feedback loop output. This arrangement prevents the signals from the output terminals from affecting each other, thereby avoiding a drop in level of the output amplitude. The unbalanced output amplitude and the phase difference between the non-inverting output terminal and the inverting output terminal of the differential amplifier are avoided.

In a clock shaping circuit of a twenty-eighth aspect, the clock generator in the clock shaping circuit includes a piezoelectric resonator, an oscillation amplifier, a voltage-controlled phase shifter for shifting a phase by a predetermined amount in response to a control voltage, and a plurality of output amplifiers, a positive feedback oscillation loop is formed of, at least, the piezoelectric resonator, the voltage-controlled phase shifter, and the oscillation amplifier, and the comparison clock signal is the output signal from one of the plurality of output amplifiers, which branch the output signal of the oscillation amplifier.

In accordance with the twenty-eighth aspect, the output signal of the oscillation amplifier is branched into a plurality of signals through the plurality of output amplifiers, and one of the output signals is used as the comparison clock signal. This arrangement eliminates the need for an external buffering driver IC, and prevents the output signal and the comparison clock signal from affecting each other. This arrangement thus requires no external components, avoiding an increase in component count, and thus leading to a compact design.

If the external output buffering driver IC is used, the phase difference occurs between the output signals due to the wiring for interconnection between the output amplifier and the buffer circuit. However, the phase difference is eliminated through the use of the plurality of output amplifiers, which branch the output signal from the oscillation amplifier, in the IC.

In a clock shaping circuit of a twenty-ninth aspect, the feedback buffering differential amplifier has a non-inverting output terminal and an inverting output terminal, one of the output terminals has the function of outputting the comparison clock signal and the other of the output terminals has the function of outputting a positive feedback oscillation loop output.

In accordance with the twenty-ninth aspect, either the non-inverting output terminal or the inverting output terminal of the feedback buffering differential amplifier in the clock generator functions as an output terminal for outputting the comparison clock signal and the other of the output terminals functions as an output terminal for outputting the positive feedback oscillation loop output signal. This arrangement eliminates the unbalance and the phase difference in the output amplitude between the non-inverting output and the inverting output in the differential amplifier.

In a clock shaping circuit of a thirtieth aspect, each of the oscillation differential amplifier and the feedback buffering differential amplifier is a differential amplifier employing an ECL line receiver.

In accordance with the thirtieth aspect, a high-speed and power saving clock shaping circuit is obtained by using the ECL line receiver to the differential amplifier.

In a clock shaping circuit of a thirty-first aspect, the phase comparator includes a first divider, which frequency-divides the input signal from the outside, a second divider, which frequency-divides the comparison clock signal, and a phase comparator circuit, which compares the phases of the output signals of the first divider and the second divider.

In accordance with the thirty-first aspect, the phase comparator includes the first and second dividers, each having a respective divide-by ratio, and the phase comparator circuit compares the low frequencies provided by the respective dividers. Using a low-speed IC, a low-cost and high precision phase comparator is provided.

In a clock shaping circuit of a thirty-second aspect, the piezoelectric resonator is a SAW resonator.

In accordance with the thirty-second aspect, the use of a SAW resonator as a piezoelectric resonator results in a high-frequency output.

In a clock shaping circuit of a thirty-third aspect, the piezoelectric resonator is a quartz crystal resonator.

In accordance with the thirty-third aspect, the use of a temperature-compensated AT cut quartz crystal resonator having no temperature-dependence as an oscillation source in the clock shaping circuit results in a reliable output.

Electronic equipment of a thirty-fourth aspect includes a clock shaping circuit of one of the first through thirty-third aspects.

In accordance with the thirty-fourth aspect, the clock shaping circuit of the thirty-fourth aspect is applied in electronic equipment such as an optical transceiver module. A clock with reduced jittering is provided in contrast to a received clock signal having large jittering resulting from a demultiplexer in the module. A timing margin is assured between received data and the clock signal. An erratic operation of a multiplexer in the optical transceiver module is thus prevented.

If the clock shaping circuit having the out-of-lock detector circuit of the present invention is incorporated in electronic equipment, a clock signal with less jittering is assured even when the clock shaping circuit is unlocked. With that clock signal, a variety of operations of the electronic equipment are continuously performed without interruptions.

BRIEF DESCRIPTION OF THE DRAWINGS

FIG. 1 is a block diagram illustrating the clock shaping circuit of a first embodiment of the present invention.

FIG. 2 is a block diagram illustrating in detail a VCSO/VCXO 4 of FIG. 1.

FIG. 3 is a block diagram illustrating the clock shaping circuit of FIG. 1 in detail.

FIG. 4 is a block diagram illustrating the construction of the clock shaping circuit of a third embodiment of the present invention.

FIG. 5 is a block diagram illustrating a DSP of FIG. 4 in detail.

FIG. 6 is a block diagram of the clock shaping circuit of a fourth embodiment of the present invention.

FIG. 7 is a block diagram of the clock shaping circuit of a fifth embodiment of the present invention.

FIG. 8 is a block diagram illustrating in detail a backup phase comparator illustrated in FIG. 7.

FIG. 9 is a block diagram of the clock shaping circuit of a sixth embodiment of the present invention.

FIG. 10 is a block diagram of the clock shaping circuit of a seventh embodiment of the present invention.

FIG. 11 is a block diagram of the clock shaping circuit of an eighth embodiment of the present invention.

FIG. 12 shows a plot of temperature characteristics of a control voltage of a voltage output circuit in accordance with the eighth embodiment of the present invention.

FIG. 13 is a block diagram illustrating the clock shaping circuit of a ninth embodiment of the present invention.

FIG. 14 is a block diagram illustrating in detail a VCSO used in the present invention.

FIG. 15 is a block diagram illustrating in detail a differential amplifier used in the present invention.

FIG. 16 is a block diagram illustrating the construction of electronic equipment of a tenth embodiment of the present invention.

FIG. 17 is a block diagram illustrating the concept of a conventional clock shaping circuit.

FIG. 18 is a block diagram illustrating the conventional clock shaping circuit.

FIG. 19 is a block diagram illustrating the conventional clock shaping circuit, which employs either a voltage-controlled quartz crystal oscillator circuit or a voltage-controlled SAW oscillator circuit.

FIG. 20 is a block diagram illustrating the conventional clock shaping circuit in which an output buffer is connected to either the output of the voltage-controlled quartz crystal oscillator circuit or the voltage-controlled SAW oscillator circuit.

DETAILED DESCRIPTION OF THE PREFERRED EMBODIMENTS

The embodiments of the present invention are discussed below with reference to the drawings.

First Embodiment

FIG. 1 is a block diagram illustrating the clock shaping circuit of a first embodiment of the present invention.

As shown, the clock shaping circuit 1 includes a phase comparator 3, which compares a comparison clock signal S2 with a signal S1 input from the outside, and generates a phase difference signal S3 based on the result of the comparison, a loop filter 2, which smoothes the phase difference signal and outputs the smoothed signal as a control voltage, and a voltage-controlled oscillator (VCSO/VCXO) 4, which changes the frequency of an output signal thereof in response to the control voltage. As will be discussed in detail later with reference to FIG. 2, the advantage of the present invention is that an output different from the output of the voltage-controlled oscillator 4 is used as a feedback loop output of the clock shaping circuit 1.

The voltage-controlled oscillator 4 may be either a voltage-controlled quartz crystal oscillator VCXO or a voltage-controlled SAW oscillator VXSO using a SAW resonator.

The phase comparator 3 is typically one block, which is packaged into an IC 2. The phase comparator 3 compares the phase of the clock signal S1 input from an unshown external device with the phase of the comparison clock signal S2 from the VCSO/VCXO 4, and outputs the phase difference signal S3 responsive to the phase difference between the two signals.

The loop filter 2 smoothes the signal output from the phase comparator 3, and outputs the smoothed signal to the VCSO/VCXO 4 as the control voltage Vc.

The VCSO/VCXO 4 is a voltage-controlled oscillator (a clock generator) and causes an SAW resonator 45a to resonate, discussed later with reference to FIG. 2. The VCSO/VCXO 4 outputs a clock signal, the frequency of which varies within a range from several tens of MHz to several hundreds of MHz in proportion to the voltage level of the control voltage Vc.

The construction of the VCSO/VCXO 4 is discussed below with reference to FIG. 2. As shown, the VCSO/VCXO 4 includes an IC 1 in which at least three differential amplifiers including an oscillation differential amplifier 41, an output differential amplifier 42, and a feedback buffering differential amplifier 43 are packaged, a voltage-controlled phase shifter 44, which adjusts the amount of phase shift in a positive feedback oscillation loop to be discussed later, and a SAW resonator 45a having a predetermined resonance frequency, and an impedance circuit 46. The positive feedback oscillation loop, including at least the oscillation differential amplifier 41, the feedback buffering differential amplifier 43, the voltage-controlled phase shifter 44, and the SAW resonator 45a, is thus formed. Each of the differential amplifiers 41, 42, and 43 is a high-speed amplifier, which complies with Standards of PECL (Positive Referenced Emitter-Coupled Logic). The differential amplifiers 41, 42, and 43 are packaged into a single chip IC (IC1).

The differential amplifiers 41, 42, and 43 will be discussed in more detail later with reference to FIG. 15.

A terminal of the end stage of the positive feedback oscillation loop of the SAW resonator 45a, which generates and outputs a source oscillation signal, is connected to a non-inverting input terminal D1 of the oscillation differential amplifier 41.

An impedance circuit 46 is connected between the non-inverting input terminal D1 and an inverting input terminal D2 of the oscillation differential amplifier 41 to generate a predetermined voltage between the two terminals. The inverting input terminal D2 of the oscillation differential amplifier 41 is biased at a bias voltage VBB.

A non-inverting output terminal of the oscillation differential amplifier 41 is connected to a non-inverting input terminal of the feedback buffering differential amplifier 43, and an inverting output terminal of the oscillation differential amplifier 41 is connected to an inverting input terminal of the feedback buffering differential amplifier 43. A non-inverting output terminal Q1 of the feedback buffering differential amplifier 43 serves as a feedback loop output for the phase comparator 3 shown in FIG. 1, and a signal output from a non-inverting output terminal Q2 of the feedback buffering differential amplifier 43 is fed to the voltage-controlled phase shifter 44. Alternatively, an output at the non-inverting output terminal Q1 may be fed to the voltage-controlled phase shifter 44, and the non-inverting output terminal Q2 may serve as the feedback loop output to the external phase comparator 3.

The voltage-controlled phase shifter 44 receives the control voltage Vc output from the loop filter 2 at the voltage control terminal VC as shown in FIG. 1, and controls the amount of phase shift in the positive feedback oscillation loop.

The non-inverting output terminal and the inverting output terminal of the oscillation differential amplifier 41 are connected to the output differential amplifier 42 at the subsequent stage thereof.

The three differential amplifiers contained in the integrated circuit IC1, namely, the voltage-controlled quartz crystal oscillator VCXO or the voltage-controlled SAW oscillator VCSO, each without the voltage-controlled phase shifter and the quartz crystal oscillator or the SAW oscillator, is commercially available as a general-purpose integrated circuit. As will be discussed later, the loop filter 2 and the phase comparator 3 are also packaged into an IC. Including the SAW resonator 45a, these components may be integrated into one system of the clock shaping circuit 1. In this way, interference between the output and the feedback loop is eliminated. The output of the voltage-controlled quartz crystal oscillator VCXO or the voltage-controlled SAW oscillator VCSO may be directly used.

A first embodiment of the present invention is discussed below with reference to FIGS. 1 and 2.

Referring to FIG. 1, the phase comparator 3 receives at an input terminal CK the clock signal S1 having jittering from an unshown external device, and compares the clock signal S1 with the comparison clock signal S2 from a feedback loop output terminal LPo of the VCSO/VCXO 4, and then outputs the phase difference signal S3 to the loop filter 2. The loop filter 2 smoothes the signal S3 representing the phase difference between the two signals, and outputs the smoothed signal as the control voltage Vc to the VCSO/VCXO 4.

In response to the control voltage Vc received at the voltage control terminal VC, the voltage-controlled phase shifter 44 shown in FIG. 2 appropriately adjusts the phase of the clock signal output from the inverting output terminal of the feedback buffering differential amplifier 43. The clock signal output from the non-inverting output terminal Q1 of the feedback buffering differential amplifier 43 is then output at the feedback loop output terminal LPo as a feedback loop output of the clock shaping circuit 1. This clock signal is then input to the phase comparator 3 as the comparison clock signal S2 as shown in FIG. 1.

The above-referenced operation is repeated in the clock shaping circuit

In accordance with the first embodiment, either the output of the non-inverting output terminal Q1 or the inverting output terminal Q2 of the feedback buffering differential amplifier 43 in the VCSO/VCXO 4 is used as the feedback loop output. This arrangement prevents the output signals from affecting each other, thereby avoiding a drop in level of the output amplitude. Furthermore, this arrangement avoids the unbalance of the output amplitude and the phase difference of the signals of the non-inverting output terminal and the inverting output terminal of the differential amplifier.

Without mutual interference described as above, there is no need for connecting an unshown discrete component such as an output buffering driver IC to the output of the voltage-controlled quartz crystal oscillator VCXO or the voltage-controlled SAW oscillator VCSO. The clock shaping circuit is miniaturized with a reduced component count.

Second Embodiment

FIG. 3 is a block diagram illustrating in detail the clock shaping circuit 1 of FIG. 1.

As shown, the clock shaping circuit 1 includes a phase comparator 3, a loop filter 2, and a VCSO/VCXO 4. The phase comparator 3 includes a (first) divider 5 having a divide-by ratio of 1/N, a (second) divider 6 having a divide-by ratio of 1/M, a phase comparator circuit 21, and a charge pump 22.

The divider 5 frequency-divides a clock signal S1 having a frequency F1 input from an unshown external device at a ratio of divide-by-N, and outputs the divided signal S4 to the phase comparator circuit 21.

The divider 6 frequency-divides a comparison clock signal S2 having a frequency F1 output from the feedback loop output terminal LPo of the VCSO/VCXO 4 at a ratio of divide-by-M, and outputs the resulting reference signal S5 to the phase comparator circuit 21.

The three blocks of the first divider 5, the second divider 6, and the phase comparator circuit 21 may be packaged into an IC 3. Since mutual interference between the output and the feedback loop are eliminated for the clock shaping circuit 1 as a system, it is possible to use the output of the VCSO/VCXO 4 without being buffered.

In the above discussion, the dividers 5 and 6 are different in divide-by ratio. The two dividers 5 and 6 may have the same divide-by ratio.

A second embodiment of the present invention will now be discussed with reference to FIG. 3.

As shown, the phase comparator 3 receives the clock signal S1 having jittering from an external device and the comparison clock signal S2 output as the feedback loop output from the feedback loop output terminal LPo of the VCSO/VCXO 4. The clock signal S1 containing jittering is frequency-divided at a ratio of divide-by-N by the divider 5 and the frequency divided signal is fed to the phase comparator circuit 21 as a clock signal S4. The comparison clock signal S2 is frequency-divided at a ratio of divide-by-M by the divider 6, and the frequency divided signal is fed to the phase comparator circuit 21 as a clock signal S5. The phase comparator circuit 21 compares, in phase, the clock signal S4 with the clock signal S5, and supplies a charge pump 22 with the results of the comparison as an UP signal and a DN signal. The charge pump 22 supplies the loop filter 2 with a phase difference signal S3. The loop filter 2 smoothes the phase difference signal S3, and outputs the smoothed signal as a control voltage Vc to the VCSO/VCXO 4.

The operation of the VCSO/VCXO 4 remains unchanged from the operation of that in the first embodiment, and the discussion thereof is omitted here.

In the above discussion, the input clock signal S1 and the clock signal output at a terminal OUT of the clock shaping circuit 1 are different in frequency. Alternatively, the two clock signals may be equal in frequency.

As described above, further to the first embodiment, the second embodiment includes the divider 5 having a ratio of divide-by-N and the divider 6 having a ratio of divide-by-M. The phase comparator 3 compares the low frequencies from the divider 5 and the divider 6. Employing a low-cost and low-speed IC, a high precision phase comparator 3 is thus fabricated.

Third Embodiment

FIG. 4 is a block diagram illustrating the construction of the clock shaping circuit of a third embodiment of the present invention. The clock shaping circuit of the third embodiment is different from that in the first embodiment in that a DSP (Digital Signal Processor) described with reference to FIG. 5 is included. FIG. 5 illustrates the DSP in detail.

Referring to FIG. 3, the phase comparator 3 in the second embodiment includes the phase comparator circuit 21 and the charge pump 22. As shown in FIG. 4, the third embodiment includes a DSP 7, which is substituted for the charge pump 22 and the loop filter 2 in the second embodiment. The dividers 5 and 6, the phase comparator circuit 21, and the DSP 7 may be packaged into an IC 2. The DSP 7 performs calculation based on a phase difference signal S6 composed of an UP signal and a DN signal shown in FIG. 4, thereby outputting the control voltage Vc to control the VCSO/VCXO 4.

Referring to FIG. 5, the DSP 7 includes a counter 35 for counting the UP signal and the DN signal, a CPU 36 for calculating a mean value of the output from the counter 35, a memory 37 for storing the results of the calculation from the CPU 36, and a D/A converter 38 for converting the calculated value stored in the memory 37 into an analog signal. In the first and second embodiments, the phase difference signal S6 output from the phase comparator circuit 21 is converted into a DC level by the charge pump 22. The loop filter 2 calculates the mean value of the output of the charge pump 22, and then outputs the mean value as the control voltage Vc. In the third embodiment, the DSP 7 performs a mean calculation on the phase difference signal S6 output from the phase comparator circuit 21 and then converts the calculation result into a DC level as the control voltage Vc.

The operation of the third embodiment of the present invention will now be discussed with reference to FIG. 4.

Referring to FIG. 4, the phase comparator circuit 21 compares, in phase, the clock signal S4, which is obtained by frequency-dividing the clock signal S1, an input from the input terminal CK, having the frequency F1 containing jittering, by the divider 5, with the clock signal S5, which is obtained by frequency-dividing the comparison clock signal S2 from the feedback loop output terminal LPo by the divider 6. The results of the comparison are fed to the DSP 7 as the phase difference signal S6. The signal S6 representing the phase difference is smoothed in the course of the calculation carried out by the DSP 7, and is then output as the control voltage Vc to the VCSO/VCXO 4.

The operation of the VCSO/VCXO 4 illustrated in FIG. 4 remains unchanged from that in the first embodiment, and the discussion thereof is omitted here.

The comparison clock signal S2 output at the feedback loop output terminal LPo of the VCSO/VCXO 4 is input to the phase comparator circuit 21. The above-referenced operation is repeated by the clock shaping circuit 1.

As described above, the third embodiment provides the same advantages as those of the first embodiment. The third embodiment further provides the following advantages.

The loop filter 2 in the first and second embodiment is typically constructed of an analog filter. The analog filter is difficult to package into an IC, and the circuit assembly having the loop filter 2 is difficult to miniaturize. The analog filter has a high impedance, and is thus subject to external noise. Since communication apparatuses for which the present invention is applied are typically used in an environment where many high-frequency noise sources are present, susceptibility to external noise is a problem. Similar PLLs are frequently present surrounding the communication apparatus, mutual interference between PLL circuits may affect the filter.

This embodiment uses the DSP 7, eliminating the need for the loop filter 2 in the preceding embodiments. Therefor by adopting ICs, the clock shaping circuit is miniaturized. The noise resistance to external noise is thus improved.

Fourth Embodiment

FIG. 6 is a block diagram of the clock shaping circuit in accordance with fourth embodiment of the present invention. The clock shaping circuit of the fourth embodiment is different from the clock shaping circuit 1 of the first embodiment in that an amplifier having one input terminal and one output terminal is substituted for the differential amplifier in the VCSO/VCXO 4. The construction of the VCSO/VCXO 4 will be discussed now.

Referring to FIG. 6, the VCSO/VCXO 4 includes an oscillation amplifier 51, and an IC 5 including a plurality of output amplifiers 52, 53, 54, . . . , a voltage-controlled phase shifter 44, and an SAW resonator 45a. A positive feedback oscillation loop includes, at least, the oscillation amplifier 51, the voltage-controlled phase shifter 44, and the SAW resonator 45a. The output signal from the oscillation amplifier 51 is branched by integrated output amplifiers 52, 53, and 54. The outputs from the output amplifiers 52 and 54 are provided as the output signals of the clock shaping circuit 1, and the output from the output amplifier 53 is provided as a comparison clock signal.

Referring to FIG. 6, the operation of the clock shaping circuit of the fourth embodiment of the present invention is discussed below.

The operation of the phase comparator 3 and the loop filter 2 remains unchanged from that in the first embodiment, and the detailed description thereof is omitted here.

With reference to FIG. 6, a resonance output of the SAW resonator 45a is input to the oscillation amplifier 51 through an input terminal D of the IC 5. The output of the oscillation amplifier 51 is output to an output terminals OUT through the output amplifiers 52 and 54 as the output signals of the clock shaping circuit 1. The output amplifier 53 outputs the comparison clock signal to the phase comparator 3. The output of the oscillation amplifier 51 is fed to the voltage-controlled phase shifter 44, and is phase shifted there by a predetermined phase.

As described above, the fourth embodiment provides the same advantages as those of the first through third embodiments. Furthermore, in the fourth embodiment, the output signal of the oscillation amplifier 53 is branched through the output amplifiers 52, 53, and 54 arranged in the IC 5 into a plurality of signals, and one of them is used as a comparison clock signal. The arrangement eliminates the need for an external output buffering driver IC, and interference between the output signal and the comparison clock signal is thus avoided. This arrangement thus requires no external components, avoiding an increase in component count, and thus leading to a compact design.

If the external output buffering driver IC is used, the phase difference occurs between the output signals due to the wiring for interconnection between the output amplifier 52 and the buffer circuit. However, through the use of the plurality of output amplifiers 52, 53, and 54 in the IC 5 to branch the output signal from the oscillation amplifier 51, the phase difference is eliminated.

Fifth Embodiment

Referring to FIG. 7, the clock shaping circuit of a fifth embodiment of the present invention includes a phase comparator 31, a quartz crystal oscillator circuit 72, a backup phase comparator 74, an out-of-lock detector 75, a selector 76 working as a switch, a loop filter 2, and a VCSO/VCXO 4 working as a voltage-controlled oscillator.

In the fifth embodiment, a main closed loop is formed of the phase comparator 31, the selector 76, the loop filter 2, and the VCSO/VCXO 4 during normal operation.

If the closed loop malfunctions in an out-of-lock state, the quartz crystal oscillator circuit 72 is used as a backup circuit. A closed loop is then formed of the backup phase comparator 74, the selector 76, the loop filter 2, and the VCSO/VCXO 4 in a backup mode to cope with out-of-lock state.

The phase comparator 31 compares, in phase, the external clock signal S1 containing jitters with the comparison clock signal S2 generated by the VCSO/VCXO 4, and feeds the signal S3 generated as a result of comparison to the selector 76.

The clock signal S1 is 622 MHz, for example. The comparison clock signal S2 generated by the VCSO/VCXO 4 is also 622 MHz, for example.

The quartz crystal oscillator circuit 72 with its temperature-compensation function has temperature independency, and generates a backup clock signal S5 of a predetermined frequency having a frequency division relationship to the clock signal S1. For example, the frequency of the backup clock signal S5 generated by the quartz crystal oscillator circuit 72 is 19.44 MHz, which is obtained by frequency-dividing the clock signal S1 at a ratio of divide-by-32.

The backup phase comparator 74 compares, in phase, a clock signal S7, which is obtained by frequency-dividing the comparison clock signal S2 from the VCSO/VCXO 4 by a divider 25, discussed later, with the backup clock signal S5 from the quartz crystal oscillator circuit 72. A signal S9 obtained as the results of comparison is output to the selector 76.

FIG. 8 is a block diagram illustrating in detail a backup phase comparator 74. In FIG. 8, the backup phase comparator 74 includes the divider 25, which receives the comparison clock signal S2 from the VCSO/VCXO 4, a backup phase comparator circuit 23, which compares, in phase, the backup clock signal S5 from the quartz crystal oscillator circuit 72 with the backup clock signal S5 from the divider 25, and a charge pump 22, which receives a phase difference signal S6 from the backup phase comparator circuit 23 as a result of the comparison.

The divider 25 frequency-divides the comparison clock signal S2 of 622 MHz at a ratio of divide-by-32, thereby resulting in an output frequency of 19.44 MHz. The ratio of divide-by-32 is one example only, and may be changed depending on the combination of the frequencies of the comparison clock signal and the input signal. The operation of the charge pump 22 remains unchanged from that discussed in connection with the first embodiment.

Returning back to FIG. 7, the out-of-lock detector 75 detects an out-of-lock state of the phases based on the phase difference between the input clock signal S1 and the comparison clock signal S2 from the VCSO/VCXO 4.

The selector 76 is a switch, which selects between the output signal from the phase comparator 31 and the output signal from the backup phase comparator 74 in response to an out-of-lock detection signal from the out-of-lock detector 75, and then feeds the selected output signal to the loop filter 2.

The loop filter 2 is a low-pass filter, which performs a smoothing process on the selected output signal from the selector 76, and then feeds the control voltage Vc obtained through the smoothing process to a control terminal of the VCSO/VCXO 4.

The VCSO/VCXO 4 is a voltage-controlled type oscillator employing a SAW (Surface Acoustic Wave) resonator. The VCSO/VCXO 4 generates the comparison clock signal S2, the frequency of which is controlled in response to the control voltage Vc from the loop filter 2. The comparison clock signal S2 is output via the buffer 9 as a clock signal S8. The comparison clock signal S2 is fed to each of the phase comparator 31 and the backup phase comparator 74.

Although FIG. 7 represents an output line of the VCSO/VCXO 4 in a single electrical wire, the number of lines can be two or more lines rather than one line. The number of lines is shown as one for exemplary purposes only. The same is true of the other drawings.

The general construction of the VCSO/VCXO 4 is discussed with reference to FIG. 14.

As shown, the VCSO/VCXO 4 includes an oscillation differential amplifier 41 and a feedback buffering differential amplifier 43 connected in cascade, and a feedback circuit connected to the cascade and composed of a switch 47, a voltage-controlled phase shifter 44, and a SAW resonator 45a.

The voltage-controlled phase shifter 44 is supplied with the control voltage Vc from the loop filter 2. An impedance circuit (Zd) 46 is connected across the two input terminals of the oscillation differential amplifier 41. A differential amplifier 42, working as a buffer, is connected to the output terminals of the oscillation differential amplifier 41. Oscillation outputs are obtained from the differential amplifier 42.

Each of the differential amplifiers 41, 42, and 43 is a high-speed amplifier, which complies with Standards of PECL (Positive Referenced Emitter-Coupled Logic). The differential amplifiers 41, 42, and 43 are packaged into a single chip IC (IC1).

FIG. 15 is a block diagram illustrating in detail a typical structure of the differential amplifiers 41, 42, and 43 illustrated in FIGS. 2 and 14. Each of the differential amplifiers 41, 42, and 43 is a differential amplifier, which is formed from the same type of emitter-opened ECL (Emitter-Coupled Logic) line receiver. The differential amplifier illustrated in FIG. 15 is the differential amplifier 12 at the output stage of the buffer 4a illustrated in FIG. 14. Emitter terminal resistors R1 and R2 as external components are respectively connected to output terminals T3' and T2'. For its power-saving feature and high-speed operation, the ECL line receiver is used in a high-frequency oscillator.

The ECL line receiver illustrated in FIG. 15 is widely known, and the detailed operation thereof is not discussed here. Transistors Tr1 and Tr2 repeat a differential operation in response to input signals (IN+ and IN−) different in phase by 180 degrees. A differential output signal amplified and shaped is output across a terminal OUT− of the transistor Tr3 and a terminal OUT+ of the transistor Tr4. A transistor Tr5 sets a variable bias level for an oscillation signal.

The operation of the clock shaping circuit of the fifth embodiment thus constructed will now be discussed with reference to FIG. 7.

A normal operation of the clock shaping circuit in a locked state is discussed first. The selector 76 selects the output signal S3 of the phase comparator 31 as an output to the loop filter 2.

A main closed loop is thus formed of the phase comparator 31, the selector 76, the loop filter 2, and the VCSO/VCXO 4, and each block operates as will be discussed below.

The phase comparator 31 compares, in phase, the clock signal S1 containing jittering with the comparison clock signal S2 from the VCSO/VCXO 4, and outputs the signal S3 responsive to the result of the comparison. The loop filter 2 performs a smoothing process on the signal S3, thereby resulting in the control voltage Vc. The control voltage Vc is then fed to the voltage control terminal of the VCSO/VCXO 4. In this way, the oscillation frequency of the VCSO/VCXO 4 is controlled.

Although the clock signal S1 contains jitters, the loop bandwidth of the closed loop, formed of the phase comparator 31, the selector 76, the loop filter 2, and the VCSO/VCXO 4, limits the frequency component of the jitter. The VCSO/VCXO 4 thus outputs the comparison clock signal S2 with the jittering thereof reduced.

The operation with the main closed loop in the unlocked state thereof is now discussed. The out-of-lock detector 75 detects an out-of-lock state, and in response to the detection of the out-of-lock state, the selector 76 selects an output signal S9 from the backup phase comparator 74.

During the out-of-lock state, a backup closed loop is formed of the backup phase comparator 74, the selector 76, the loop filter 2, and the VCSO/VCXO 4. Each block operates as discussed below.

The backup phase comparator 74 compares, in phase, the backup clock signal S5 generated by the quartz crystal oscillator circuit 72 with the output S7, which is obtained by frequency-dividing the comparison clock signal S2 from the VCSO/VCXO 4 by the divider 25 as shown in FIG. 8, and then outputs a signal S9 responsive to the result of the comparison. The output S9 is selected by the selector 76, and is then subjected to a smoothing process in the loop filter 2. The smoothed signal is then applied to a voltage control terminal of the VCSO/VCXO 4 as a control voltage Vc.

The VCSO/VCXO 4 gives a stable clock signal S2 with the jittering thereof reduced.

As described above, the clock shaping circuit of the fifth embodiment switches the main closed loop to the backup closed loop and uses the comparison clock signal S2 from the VCSO/VCXO 4 and the backup clock signal S5 from the quartz crystal oscillator circuit 72 if the supply of the external clock signal is interrupted for some reason or if the closed loop is unlocked due to excessive jittering in the clock signal.

The fifth embodiment provides a reliable clock signal with jittering thereof reduced even if the main closed loop enters a free run condition for some reason.

Referring to FIG. 2, the VCSO/VCXO 4 is formed of the differential amplifier employing the ECL line receiver. Packaging the VCSO/VCXO 4 into an integrated circuit is easy, and the clock shaping circuit is thus miniaturized.

Sixth Embodiment

The clock shaping circuit of a sixth embodiment of the present invention is discussed below with reference to FIG. 9.

As shown, the clock shaping circuit 1 of the sixth embodiment includes a phase comparator 31, a quartz crystal oscillator circuit 72, a backup phase comparator 74, a first loop filter 77, a second loop filter 78, an out-of-lock detector 75, a selector 76 serving as a switch, and a VCSO/VCXO 4 as serving as a voltage-controlled oscillator.

During normal operation, the clock shaping circuit of the sixth embodiment establishes a main closed loop, which is formed of the phase comparator 31, the first loop filter 77, the selector 76, and the VCSO/VCXO 4.

When the clock shaping circuit malfunction with the closed loop unlocked, the output of the quartz crystal oscillator circuit 72 is used as a backup. In response to the malfunction, a backup closed loop is established, which is formed of the backup phase comparator 74, the second loop filter 78, the selector 76, and the VCSO/VCXO 4.

The phase comparator 31 compares, in phase, the external clock signal S1 containing jitters with the comparison clock signal S2 generated by the VCSO/VCXO 4, and outputs a signal S3 responsive to the result of the comparison to the first loop filter 77.

The temperature-compensated quartz crystal oscillator circuit 72 having temperature independency generates a backup clock signal S5 having a predetermined frequency comparable to the clock signal S1 in frequency division.

The backup phase comparator 74 compares, in phase, the comparison clock signal S2 from the VCSO/VCXO 4 with the backup clock signal S5 from the quartz crystal oscillator circuit 72, and outputs a signal S9 responsive to the result of the comparison to the second loop filter 78. Referring to FIG. 8, a backup phase comparator circuit 23 in the backup phase comparator 74 compares, in phase, an output signal S7, which is obtained by frequency-dividing the comparison clock signal S2 by the divider 25, with a signal S5 from the quartz crystal oscillator circuit 72.

The first loop filter 77 is a low-pass filter, which performs a smoothing process on the output signal S3 from the phase comparator 31, and a control voltage Vc1 obtained through the smoothing process is output to the selector 76.

The second loop filter 78 is a low-pass filter, which performs a smoothing process on the output signal S9 from the backup phase comparator 74, and a control voltage Vc2 obtained through the smoothing process is output to the selector 76.

The out-of-lock detector 75 detects an out-of-lock state in the phases based on the phase difference between the input clock signal S1 and the comparison clock signal S2 from the VCSO/VCXO 4.

In response to the detection of the out-of-lock detector 16, the selector 76 is a switch, which selects between the control voltage Vc1, namely, the output signal from the first loop filter 77, and the control voltage Vc2, namely, the output signal from the second loop filter 78, and feeds the selected voltage Vc to the voltage control terminal of the VCSO/VCXO 4.

The VCSO/VCXO 4 here, identical in construction to the VCSO/VCXO 4 illustrated in FIG. 2, generates the comparison clock signal S2, the oscillation frequency of which is varied in response to the control voltage Vc from the selector 76. The clock signal S2 is then output through the buffer 9. The comparison clock signal S2 is also output to each of the phase comparator 31 and the backup phase comparator 74.

The operation of the clock shaping circuit of the sixth embodiment thus constructed is discussed below with reference to FIG. 9.

The operation of the clock shaping circuit with the closed loop in the locked state is discussed below. The selector 76 selects and outputs the control voltage Vc1 from the first loop filter 77.

A main closed loop is established, which is formed of the phase comparator 31, the first loop filter 77, the selector 76, and the VCSO/VCXO 4. The operation of each block is discussed below.

The phase comparator 31 compares, in phase, the clock signal S1 containing jitters with the comparison clock signal S2 from the VCSO/VCXO 4, and outputs the signal S3 responsive to the result of the comparison. The output is then subjected to a smoothing process in the first loop filter 77, becoming the control voltage Vc1. The control voltage Vc1 is selected by the selector 76 and is then applied to the voltage control terminal of the VCSO/VCXO 4 as a control voltage Vc. Although the clock signal S1 contains jitters, the loop bandwidth of the closed loop, formed of the phase comparator 31, the first loop filter 77, the selector 76, and the VCSO/VCXO 4 limits the frequency component of the jitter. The VCSO/VCXO 4 thus outputs the comparison clock signal S2 with the jittering thereof reduced.

The operation of the clock shaping circuit with the main closed loop in the unlocked state thereof is now discussed. The out-of-lock detector 75 detects an out-of-lock state, and in response to the detection of the out-of-lock state, the selector 76 selects the control voltage Vc2 from the second loop filter 78.

During the out-of-lock state, a backup loop is established, which is formed of the backup phase comparator 74, the second loop filter 78, the selector 76, and the VCSO/VCXO 4. Each of these blocks operates as described below.

The backup phase comparator circuit 23 in the backup phase comparator 74 compares, in phase, the signal S5 from the quartz crystal oscillator circuit 72 with the output signal S7, which is obtained by frequency-dividing the comparison clock signal S2 from the VCSO/VCXO 4 by the divider 25, and then outputs the signal S9 responsive to the result of the comparison to the second loop filter 78. The output is then subjected to a smoothing process through the second loop filter 78, becoming the control voltage Vc2. The control voltage Vc2 is selected by the selector 76, and is then fed to the voltage control terminal of the VCSO/VCXO 4 as the control voltage Vc.

The VCSO/VCXO 4 gives a stable output, thereby outputting a stable clock signal S8 with the jittering thereof reduced through the buffer 9.

As described above, the clock shaping circuit of the sixth embodiment switches the main closed loop to the backup closed loop and uses the backup clock signal S5 from the quartz crystal oscillator circuit 72 if the standard loop is unlocked. The sixth embodiment provides the same advantages as those of the first embodiment. Since the two loop filters, including the second loop filter, in particular, are arranged, low-frequency characteristics appropriate for one closed loop including the phase comparator 31 and the other closed loop including the backup phase comparator 74 are respectively set for the two loop filters. The stability of the closed loop is thus increased, thereby resulting in a more stable clock signal.

Seventh Embodiment

The clock shaping circuit of a seventh embodiment of the present invention will now be described with reference to FIG. 10. FIG. 10 is a block diagram of the clock shaping circuit of the seventh embodiment of the present invention.

A phase comparator circuit 21 compares a signal S4, which is obtained by frequency-dividing an external clock signal S1 by a divider 5, with a signal S5, which is obtained by frequency-dividing a comparison clock signal S2 from a VCSO/VCXO 4 by a divider 6, and outputs, to a DSP 81, a phase difference signal S3 (an up signal UP if the comparison clock signal S2 lags the input signal S1, or a down signal DN if the comparison clock signal S2 leads the input signal S1).

In accordance with the seventh embodiment, the charge pump 22 and the first loop filter 77 arranged subsequent thereto in the phase comparator 3 illustrated in FIG. 9 are replaced with the DSP (Digital Signal Processor) 81 in a single-chip integrated circuit (IC), and the charge pump and the second loop filter 78 arranged subsequent thereto in the backup phase comparator 74 illustrated in FIG. 9 are replaced with a second DSP 82.

The rest of the construction of the clock shaping circuit of the seventh embodiment remains unchanged from that in the sixth embodiment illustrated in FIG. 9, and like components are designated with like reference numerals, and the discussion thereof is omitted here.

The DSP in the single-chip integrated circuit is used because of the following reason. Each of the first loop filter 77 and the second loop filter 78 illustrated in FIG. 9 is fabricated of an analog filter. The analog filter is typically difficult to package into an integrated circuit. The circuit board thereof is accordingly difficult to miniaturize.

The analog filter has a high impedance, and is susceptible to external noise. Since communication apparatuses for which the sixth embodiment of the present invention is applied are typically used in an environment where many high-frequency noise sources are present, susceptibility to external noise is a problem. PLLs similar to the one in the clock shaping circuit of the sixth embodiment are frequently present surrounding the communication apparatus, mutual interference between PLL circuits may affect the filter.

In accordance with the seventh embodiment, the DSP in the single chip IC is substituted for the charge pump and the loop filter to resolve the above problem. The seventh embodiment eliminates the need for the two loop filters in the closed loops, thereby miniaturizing the clock shaping circuit and heightening noise resistance.

Eighth Embodiment

The clock shaping circuit of an eighth embodiment of the present invention will now be discussed with reference to FIG. 11. FIG. 11 is a block diagram of the clock shaping circuit of the eighth embodiment of the present invention.

As shown, the clock shaping circuit of the eighth embodiment includes a phase comparator 31, a loop filter 2, a voltage output circuit 83, an out-of-lock detector 75, a selector 76 functioning as a switch, and a VCSO/VCXO 4 functioning as a voltage-controlled oscillator circuit.

During normal operation, the eighth embodiment establishes a main closed loop formed of the phase comparator 31, the loop filter 2, the selector 76, and the VCSO/VCXO 4.

When the clock shaping circuit malfunctions with the main closed loop unlocked, the selector 76 switches from the output of the loop filter 2 to the output of the voltage output circuit 83.

The phase comparator 31 compares, in phase, an external clock signal S1 containing jitters with a comparison clock signal S2 generated by the VCSO/VCXO 4, and outputs a signal S3 responsive to the result of the comparison to the loop filter 2.

Like the phase comparator 3 illustrated in FIG. 3, the phase comparator 31 includes a phase comparator circuit 21 and a charge pump, both not shown.

The loop filter 2 is a low-pass filter, which performs a smoothing process on the output signal of the phase comparator 31, and the smoothed signal is then fed to the selector 76.

The voltage output circuit 83 outputs a predetermined voltage Vc2 corresponding to the control voltage Vc1 output from the loop filter 2, and is a constant voltage regulator circuit, for example.

The out-of-lock detector 75 detects an out-of-lock state in the phases based on the phase difference between the input clock signal S1 and the comparison clock signal S2 from the VCSO/VCXO 4.

In response to the detection of the out-of-lock detector 75, the selector 76 is a switch, which selects between the control voltage Vc1 of the loop filter 2 and the control voltage Vc2 of the voltage output circuit 83, and feeds the selected control voltage Vc to a voltage control terminal of the VCSO/VCXO 4.

The VCSO/VCXO 4 here, identical in construction to the VCSO/VCXO 4 illustrated in FIG. 14, generates the comparison clock signal S2, the oscillation frequency of which is varied in response to the control voltage Vc of the selector 76.

The operation of the clock shaping circuit of the eighth embodiment thus constructed will be described with reference to FIG. 11.

The normal operation of the clock shaping circuit with the closed loop locked is discussed below. The selector 76 selects the control voltage Vc1 from the loop filter 2. During the locked state, a main closed loop is established, which is formed of the phase comparator 31, the loop filter 2, the selector 76, and the VCSO/VCXO 4. Each of these blocks operates as below.

The phase comparator 31 compares, in phase, a clock signal S1 containing jitters with a comparison clock signal S2 from the VCSO/VCXO 4, and outputs a signal S3 responsive to the result of the comparison. The output is then subjected to a smoothing process through the loop filter 2, becoming the control voltage Vc1. The control voltage Vc1 is selected by the selector 76, and is then applied to the voltage control terminal of the VCSO/VCXO 4 as a control voltage Vc. Although the clock signal S1 contains jitters, a closed loop, formed of the phase comparator 31, the selector 76, and the VCSO/VCXO 4 limits the frequency component of the jitter to the loop bandwidth thereof. The VCSO/VCXO 4 thus outputs the comparison clock signal S2 with the jittering thereof reduced.

The operation of the clock shaping circuit with the main closed loop unlocked is discussed below. The out-of-lock detector 75 detects an out-of-lock state, and in response to the detection of the out-of-lock detector 75, the selector 76 selects and outputs the control voltage Vc2 from the voltage output circuit 83.

During the out-of-lock state, the control voltage Vc applied to the voltage control terminal of the VCSO/VCXO 4 is a predetermined constant voltage output by the voltage output circuit 83, corresponding to the output of the loop filter 2. The jittering in the comparison clock signal S2 output from the VCSO/VCXO 4 is substantially reduced compared with the external clock signal S2 containing jitters. Since the frequency of the comparison clock signal S2 is stabilized by the voltage output circuit 83, the VCSO/VCXO 4 outputs a clock signal S8 with the jittering thereof reduced, through the buffer 9.

As described above, the eighth embodiment disengages the main closed loop if the main closed loop is unlocked. The predetermined constant control voltage Vc2 output from the voltage output circuit 83 is applied to the VCSO/VCXO 4. The eighth embodiment of the clock shaping circuit provides the same advantages as those of the first embodiment. As described above, to improve frequency-temperature characteristics of the VCSO, the constant voltage of the voltage output circuit 83 may have temperature dependency that cancels characteristics in a low temperature region and a high temperature region (for temperature compensation) as shown in FIG. 12.

Ninth Embodiment

The clock shaping circuit of a ninth embodiment of the present invention will now be discussed with reference to FIG. 13. FIG. 13 is a block diagram illustrating the clock shaping circuit of the ninth embodiment of the present invention.

In the clock shaping circuit illustrated in FIG. 13, the DSP 81 is substituted for the charge pump and the loop filter 2 in the phase comparator 31 illustrated in FIG. 11. This arrangement is based on the same concept that is implemented in the seventh embodiment illustrated in FIG. 10.

The rest of the construction of the clock shaping circuit of the ninth embodiment remains unchanged from that of the eighth embodiment illustrated in FIG. 11. Like elements are designated with like reference numerals, and the discussion thereof is omitted here.

In comparison with the eighth embodiment in FIG. 11, the ninth embodiment eliminates the need for the two loop filters in the closed loops, thereby miniaturizing the clock shaping circuit and heightening noise resistance.

Tenth Embodiment

FIG. 16 is a block diagram illustrating a construction of electronic equipment of a tenth embodiment of the present invention incorporating the clock shaping circuit of one of the above-referenced embodiments. The electronic equipment incorporating the clock shaping circuit will be discussed with reference to FIG. 16.

FIG. 16 illustrates an optical transceiver module 100 having a modular structure for use in a 10 Gbits/s optical network. The optical transceiver module 100 includes one of the clock shaping circuits of the first through ninth embodiments as a clock shaping circuit 103.

Referring to FIG. 16, the optical transceiver module 100 includes a multiplexer 101, an electrical to optical converter 102, and the clock shaping circuit 103 in a transmitter system for transmitting data. A receiver system for receiving data includes an optical to electrical converter 105 and a demultiplexer 104. The optical transceiver module 100 has the function of electrical to optical conversion, the function of optical to electrical conversion, and the function of interface for multiplexing and demultiplexing.

A controller 106 controls each block in the optical transceiver module 100. In response to a control signal, a selector 107 selectively outputs an external reference clock signal and a received clock signal extracted by the demultiplexer 104 to the clock shaping circuit 103.

In the optical transceiver module 100 thus constructed, the clock shaping circuit 103 generates a clock signal with the jittering thereof reduced based on the external reference clock signal, and feeds the clock signal to the multiplexer 101 as a reference clock signal.

Even when the jitter containing received clock signal from the demultiplexer 104 is used, the clock shaping circuit 103 reduces jittering. A timing margin between transmission data and the clock signal is assured in the multiplexer 101. An erratic operation in the multiplexer 101 in the optical transceiver module 100 is thus avoided.

The optical transceiver module 100 assures a reliable operation even over a high-speed network system, such as a 10 Gbits/s Ethernet (trademark), which transmits a great deal of data such as a moving picture.

The tenth embodiment provides a clock signal containing reduced jittering using the clock shaping circuit of one of the fifth through ninth embodiments when the clock shaping circuit 103 is unlocked for some reason. The optical transceiver module 100 continuously operates without interrupting communication operations.

Modifications of the Embodiments

In the above discussion, the signal having the oscillation frequency is fed to the non-inverting input terminal D1 of the oscillation differential amplifier 41 via the impedance circuit 46 illustrated in FIGS. 2 and 14, and the bias voltage VBB is fed to the inverting input terminal D2 of the oscillation differential amplifier 41. Alternatively, the oscillation signal may be fed to the inverting input terminal D2 and the bias signal VBB may be fed to the non-inverting input terminal D1.

The clock shaping circuit is used in the optical transceiver module for an optical network in the tenth embodiment. The clock shaping circuit may be employed in a diversity of pieces of equipment including radio communication apparatuses operating on a high frequency region, such as a mobile telephone.

The clock shaping circuit uses the voltage-controlled oscillator circuit including a SAW resonator, namely, a surface acoustic wave element as a reference clock source. Alternatively, an AT cut quartz crystal resonator may be used.

The piezoelectric materials, forming a piezoelectric resonator such as a quartz crystal resonator, a ceramic resonator, a SAW resonator, may be langasite crystal, or LBO (lithium tetraborate) besides quartz crystal.

Advantages

In accordance with the present invention, either the output of the non-inverting output terminal or the inverting output terminal of the voltage-controlled oscillator circuit is used as the feedback loop output. This arrangement prevents the outputs of the voltage-controlled oscillator circuit from affecting each other, thereby avoiding a drop in level of the output amplitude. This arrangement eliminates the unbalance in the output amplitude and phase difference between the outputs of the non-inverting output terminal and the inverting output terminal of the differential amplifier.

Connecting the output buffering driver IC to the output of the voltage-controlled quartz crystal oscillator VCXO or the voltage-controlled SAW oscillator VCSO is unnecessary to avoid above inconveniences. The clock shaping circuit is reduced in component count, and miniaturized.

In accordance with the present invention, the frequency-temperature characteristics are improved if the voltage-controlled SAW oscillator VCSO is used. An output clock signal containing less phase noise and less jittering results.

In accordance with the present invention, a reliable clock signal with jittering reduced is provided even when the closed loop is shifted into a free-running state for some reason.

The electronic equipment of the present invention assures a clock signal with less jittering even when the clock shaping circuit is unlocked for some reason. A variety of operations are continuously performed without interruption.

The entire disclosures of Japanese Patent Application Nos. 2001-338046 filed Nov. 2, 2001, 2002-079761 filed Mar. 20, 2002, and 2002-279287 filed Sep. 25, 2002 are incorporated by references herein.

What is claimed is:

1. A clock shaping circuit comprising:
   a clock generator, which changes a frequency of an output comparison clock signal in response to a supplied control voltage;
   a phase comparator, which generates a phase difference signal based on a comparison of the comparison clock signal from the clock generator with an input signal from an external source; and a loop filter for smoothing the phase difference signal and providing the control voltage;

wherein the clock generator includes a positive feedback oscillation loop including a piezoelectric resonator, an oscillation differential amplifier, a feedback buffering differential amplifier, and a voltage-controlled phase shifter for shifting a phase by a predetermined amount in response to the control voltage; and wherein the output signal from the feedback buffering differential amplifier is the comparison clock signal.

2. A clock shaping circuit according to claim 1, wherein the feedback buffering differential amplifier has a non-inverting output terminal and an inverting output terminal, one of the output terminals outputting the comparison clock signal and the other of the output terminals outputting a positive feedback oscillation loop output.

3. A crock shaping circuit according to claim 1, wherein each of the oscillation differential amplifier and the feedback buffering differential amplifier is a differential amplifier employing an ECL line receiver.

4. A clock shaping circuit according to claim 1, wherein the phase comparator comprises a first divider means for frequency-dividing the input signal from the external source; and a second divider means for frequency-dividing the comparison clock signal.

5. A clock shaping circuit according to claim 1, wherein the feedback buffering differential amplifier has a non-inverting output terminal and an inverting output terminal, one of the output terminals outputting the comparison clock signal and the other of the output terminals outputting a positive feedback oscillation loop output;

wherein each of the oscillation differential amplifier and the feedback buffering differential amplifier is a differential amplifier employing an ECL line receiver; and wherein the piezoelectric resonator further comprises a SAW resonator or a quartz crystal resonator.

6. A clock shaping circuit comprising:

a clock generator, which changes a frequency of an output comparison clock signal in response to a supplied control voltage;

a phase comparator, which generates a phase difference signal based on a comparison of the comparison clock signal from the clock generator with an input signal from an external source; and a loop filter for smoothing the phase difference signal and providing the control voltage;

wherein the clock generator includes a positive feedback oscillation loop including a piezoelectric resonator, a voltage-controlled phase shifter, and an oscillation amplifier, and a plurality of output amplifiers; and wherein the comparison clock signal is the output signal from one of the plurality of output amplifiers, which branch the output signal of the oscillation amplifier.

7. A clock shaping circuit comprising:

a phase comparator, which compares an input clock signal with a comparison clock signal, in phase, and outputs a signal responsive to the comparison, a quartz crystal oscillator, which generates a backup clock signal having a predetermined frequency corresponding to the input clock signal, a backup phase comparator, which compares, in phase, the backup clock signal generated by the quartz crystal oscillator with the comparison clock signal and outputs a signal responsive to the back-up phase comparison, an PLL lock detector, which detects a phase out-of-lock state based on the input clock signal and the comparison clock signal, a selector, which selects and outputs either the output signal of the phase comparator or the output signal of the backup phase comparator in response to the detection of the lock detector, a loop filter, which performs a smoothing process on the output signal selected by the selector, and a clock generator, which generates the comparison clock signal while varying the frequency of the comparison clock signal in accordance with the output signal of the loop filter.

8. A clock shaping circuit according to claim 7, wherein the quartz crystal oscillator further comprises a temperature-compensated quartz crystal oscillator;

wherein the backup phase comparator comprises a divider, which frequency-divides the comparison clock signal generated by the clock generator, and wherein the backup phase comparator compares, in phase, the predetermined backup clock signal generated by the quartz crystal oscillator and the output signal of the divider, and outputs a signal responsive to the backup phase comparison; and wherein the clock generator further comprises a voltage-controlled SAW oscillator or a voltage-controlled quartz crystal oscillator.

9. A clock shaping circuit according to claim 8, wherein:

the clock generator in the clock shaping circuit further comprises a piezoelectric resonator, an oscillation differential amplifier, a feedback buffering differential amplifier, and a voltage-controlled phase shifter for shifting a phase by a predetermined amount in response to the control voltage;

a positive feedback oscillation loop is formed of the piezoelectric resonator, the oscillation differential amplifier, the feedback buffering differential amplifier, and the voltage-controlled phase shifter, and the output signal of the feedback buffering differential amplifier further comprises the comparison clock signal;

wherein the feedback buffering differential amplifier has a non-inverting output terminal and an inverting output terminal, one of the output terminals outputting the comparison clock signal and the other of the output terminals outputting a positive feedback oscillation loop output;

wherein each of the oscillation differential amplifier and the feedback buffering differential amplifier is a differential amplifier employing an ECL line receiver.

10. A clock shaping circuit comprising:

a phase comparator, which compares, in phase, an input clock signal with a comparison clock signal, and outputs a signal responsive to the comparison, a quartz crystal oscillator, which generates a backup clock signal having a predetermined frequency corresponding to the input clock signal, a backup phase comparator, which compares, in phase, the backup clock signal generated by the quartz crystal oscillator with the comparison clock signal and outputs a signal responsive to the backup phase comparison, a first loop filter, which performs a smoothing process on the output signal of the phase comparator, a second loop filter, which performs a smoothing process on the output signal of the backup phase comparator, an PLL lock detector, which detects a phase out-of-lock state based on the input clock signal and the comparison clock signal, a selector, which selects and outputs either the output signal of the first loop filter or the output signal of the second loop filter, in response to the detection of the PLL lock detector, and a clock generator, which generates the comparison clock signal while varying the frequency of the comparison clock signal in accordance with the output signal selected by the selector.

11. A clock shaping circuit according to claim 10, wherein the quartz crystal oscillator further comprises a temperature-compensated quartz crystal oscillator;

wherein the backup phase comparator compares, in phase, an output signal, which is obtained by frequency-dividing the comparison clock signal generated by the clock generator by the divider, with the predetermined backup clock signal generated by the quartz crystal oscillator and outputs a signal responsive to the backup phase comparison; and wherein the clock generator further comprises a voltage-controlled SAW oscillator or a voltage-controlled quartz crystal oscillator.

12. A clock shaping circuit according to claim 11, wherein the phase comparator further comprises a first charge pump, which converts the output of a phase comparator circuit into a DC voltage corresponding to a phase difference of an input signal to the phase comparator, and wherein the backup phase comparator comprises a second charge pump, which converts the output of a phase comparator circuit into a DC voltage corresponding to a phase difference of an input signal to the phase comparator.

13. A clock shaping circuit according to claim 12, wherein a first digital signal processor (DSP) is substituted for the first charge pump and the first loop filter, and wherein a second digital processor (DSP) is substituted for the second charge pump and the second loop filter.

14. A clock shaping circuit according to claim 11, wherein:

the clock generator in the clock shaping circuit further comprises a piezoelectric resonator, an oscillation differential amplifier, a feedback buffering differential amplifier, and a voltage-controlled phase shifter for shifting a phase by a predetermined amount in response to the control voltage;

a positive feedback oscillation loop is formed of the piezoelectric resonator, the oscillation differential amplifier, the feedback buffering differential amplifier, and the voltage-controlled phase shifter, and the output signal of the feedback buffering differential amplifier further comprises the comparison clock signal;

wherein the feedback buffering differential amplifier has a non-inverting output terminal and an inverting output terminal, one of the output terminals outputting the comparison clock signal and the other of the output terminals outputting a positive feedback oscillation loop output;

wherein each of the oscillation differential amplifier and the feedback buffering differential amplifier is a differential amplifier employing an ECL line receiver.

15. A clock shaping circuit comprising:

a phase comparator, which compares, in phase, an input clock signal with a comparison clock signal, and outputs a signal responsive to the comparison, a loop filter, which performs a smoothing process on the output signal of the phase comparator, a voltage output circuit, which outputs a predetermined voltage responsive to the output signal of the loop filter, an PLL lock detector, which detects a phase out-of-lock state based on the input clock signal and the comparison clock signal, a selector, which selects and outputs either the output signal of the loop filter or the output signal of the voltage output circuit in response to the detection of the PLL lock detector, and a clock generator, which generates the comparison clock signal while varying the frequency of the comparison clock signal in accordance with the output signal selected by the selector.

16. A clock shaping circuit according to claim 15, wherein the clock generator further comprises a voltage-controlled SAW oscillator a voltage controlled quartz crystal oscillator.

17. A clock shaping circuit according to claim 16 wherein the phase comparator further comprises a charge pump, which converts the output of a phase comparator circuit into a DC voltage responsive to the phase difference of an input signal to the phase comparator.

18. A clock shaping circuit according to claim 17, wherein a digital signal processor (DSP) is substituted for the charge pump and the loop filter.

19. A clock shaping circuit according to claim 16 wherein the voltage output circuit sets the predetermined voltage to a voltage at a variable level.

20. A clock shaping circuit according to claim 19, the clock generator in the clock shaping circuit further comprises a piezoelectric resonator, an oscillation differential amplifier, a feedback buffering differential amplifier, and a voltage-controlled phase shifter for shifting a phase by a predetermined amount in response to the control voltage;

a positive feedback oscillation loop is formed of the piezoelectric resonator, the oscillation differential amplifier, the feedback buffering differential amplifier, and the voltage-controlled phase shifter, and the output signal of the feedback buffering differential amplifier further comprises the comparison clock signal;

wherein the feedback buffering differential amplifier has a non-inverting output terminal and an inverting output terminal, one of the output terminals outputting the comparison clock signal and the other of the output terminals outputting a positive feedback oscillation loop output;

wherein each of the oscillation differential amplifier and the feedback buffering differential amplifier is a differential amplifier employing an ECL line receiver.

21. A clock shaping circuit according to claim 16, wherein the output voltage of the voltage output circuit has a temperature-dependent property so that the oscillation output of the clock generator is temperature compensated.

22. A clock shaping circuit according to claim 21, wherein each the clock generator in the clock shaping circuit further comprises a piezoelectric resonator, an oscillation differential amplifier, a feedback buffering differential amplifier, and a voltage-controlled phase shifter for shifting a phase by a predetermined amount in response to the control voltage;

a positive feedback oscillation loop is formed of the piezoelectric resonator, the oscillation differential amplifier, the feedback buffering differential amplifier, and the voltage-controlled phase shifter, and the output signal of the feedback buffering differential amplifier further comprises the comparison clock signal;

wherein the feedback buffering differential amplifier has a non-inverting output terminal and an inverting output terminal, one of the output terminals outputting the comparison clock signal and the other of the output terminals outputting positive feedback oscillation loop output;

wherein each of the oscillation differential amplifier and the feedback buffering differential amplifier is a differential amplifier employing an ECL line receiver.

* * * * *